(12) United States Patent
Li et al.

(10) Patent No.: US 12,557,338 B2
(45) Date of Patent: Feb. 17, 2026

(54) SEMICONDUCTOR STRUCTURE HAVING A BACKSIDE CONTACT WITH BACKSIDE SIDEWALL SPACERS

(71) Applicant: International Business Machines Corporation, Armonk, NY (US)

(72) Inventors: Tao Li, Slingerlands, NY (US); Julien Frougier, Albany, NY (US); Min Gyu Sung, Latham, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 17/982,809

(22) Filed: Nov. 8, 2022

(65) Prior Publication Data

US 2024/0154009 A1    May 9, 2024

(51) Int. Cl.

| | |
|---|---|
| *H01L 29/417* | (2006.01) |
| *H01L 23/522* | (2006.01) |
| *H01L 23/528* | (2006.01) |
| *H01L 27/088* | (2006.01) |
| *H01L 29/06* | (2006.01) |
| *H01L 29/423* | (2006.01) |
| *H01L 29/775* | (2006.01) |
| *H01L 29/786* | (2006.01) |

(Continued)

(52) U.S. Cl.
CPC ..... *H10D 30/6729* (2025.01); *H01L 23/5226* (2013.01); *H01L 23/5283* (2013.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6729; H10D 30/6735; H10D 30/6757; H10D 30/797; H10D 62/021; H10D 62/118; H10D 62/119; H10D 62/121; H10D 62/149; H10D 62/151; H10D 64/017; H10D 64/258; H10D 84/0128; H10D 84/013; H10D 84/0158; H10D 84/017; H10D 84/0193; H10D 84/83; H10D 84/834; H10D 84/853; H01L 23/5226; H01L 23/5283; H01L 23/5286

See application file for complete search history.

(56) References Cited

U.S. PATENT DOCUMENTS 10,797,139 B2    10/2020    Morrow et al.
11,145,550 B2    10/2021    Wang et al.
(Continued)

OTHER PUBLICATIONS

A. Gupta et al., "Buried Power Rail Integration with FinFETs for Ultimate CMOS Scaling," IEEE Transactions on Electron Devices, Dec. 2020, pp. 5349-5354, vol. 67, No. 12.

(Continued)

*Primary Examiner* — David C Spalla
(74) *Attorney, Agent, or Firm* — Samuel Waldbaum; Ryan, Mason & Lewis, LLP

(57) ABSTRACT

A semiconductor structure includes a source/drain region having a backside surface disposed in a backside interlayer dielectric layer, a backside contact disposed in the backside interlayer dielectric layer, wherein the backside contact is disposed on the backside surface of the source/drain region, backside sidewall spacers disposed between sidewalls of the backside interlayer dielectric layer and sidewalls of the backside contact and the backside surface of the source drain region, and a backside power rail connected to the source/drain region through the backside contact.

20 Claims, 31 Drawing Sheets

(51) Int. Cl.
- *H10D 30/43* (2025.01)
- *H10D 30/67* (2025.01)
- *H10D 62/10* (2025.01)
- *H10D 64/23* (2025.01)
- *H10D 84/83* (2025.01)
- *H10D 30/01* (2025.01)
- *H10D 64/01* (2025.01)
- *H10D 84/01* (2025.01)
- *H10D 84/03* (2025.01)

(52) U.S. Cl.
CPC ......... *H01L 23/5286* (2013.01); *H10D 30/43* (2025.01); *H10D 30/6735* (2025.01); *H10D 30/6757* (2025.01); *H10D 62/121* (2025.01); *H10D 64/258* (2025.01); *H10D 84/83* (2025.01); *H10D 30/014* (2025.01); *H10D 64/01* (2025.01); *H10D 64/015* (2025.01); *H10D 64/017* (2025.01); *H10D 64/018* (2025.01); *H10D 64/021* (2025.01); *H10D 84/0128* (2025.01); *H10D 84/013* (2025.01); *H10D 84/0149* (2025.01); *H10D 84/038* (2025.01)

(56) References Cited

U.S. PATENT DOCUMENTS

| | | |
|---|---|---|
| 11,404,548 B2 | 8/2022 | Yu et al. |
| 2021/0111115 A1 | 4/2021 | Morrow et al. |
| 2021/0134721 A1 | 5/2021 | Chiang et al. |
| 2021/0202385 A1 | 7/2021 | Huang et al. |
| 2021/0305252 A1 | 9/2021 | Chiang et al. |
| 2021/0305381 A1 | 9/2021 | Chiang et al. |
| 2021/0343578 A1 | 11/2021 | Chang et al. |
| 2021/0351079 A1 | 11/2021 | Su et al. |
| 2021/0351303 A1 | 11/2021 | Ju et al. |
| 2021/0359091 A1 | 11/2021 | Hsu et al. |
| 2021/0376071 A1 | 12/2021 | Liu et al. |
| 2021/0376093 A1 | 12/2021 | Chu et al. |
| 2021/0399109 A1 | 12/2021 | Su et al. |
| 2022/0139911 A1* | 5/2022 | Wei ............... H01L 23/5226 257/365 |
| 2022/0223698 A1 | 7/2022 | Xie et al. |
| 2022/0359265 A1* | 11/2022 | Chang ............. H01L 23/485 |
| 2024/0021684 A1* | 1/2024 | Lin ............... H01L 23/5286 |
| 2024/0387653 A1* | 11/2024 | Khaderbad ....... H10D 30/6735 |

OTHER PUBLICATIONS

D. Radisic et al. "Middle-of-line Plasma Dry Etch Challenges for Buried Power Rail Integration," Advanced Etch Technology and Process Integration for Nanopatterning, May 2022, pp. 87-94, vol. 12056.

K. Serbulova et al., "Enabling Active Backside Technology for ESD and LU Reliability in DTCO/STCO," IEEE Symposium on VLSI Technology and Circuits, Jun. 2022, pp. 431-432.

S. Subramanian et al., "First Monolithic Integration Of 3D Complementary FET (CFET) on 300mm Wafers," IEEE Symposium on VLSI Technology, Jun. 2020, pp. 1-2.

* cited by examiner

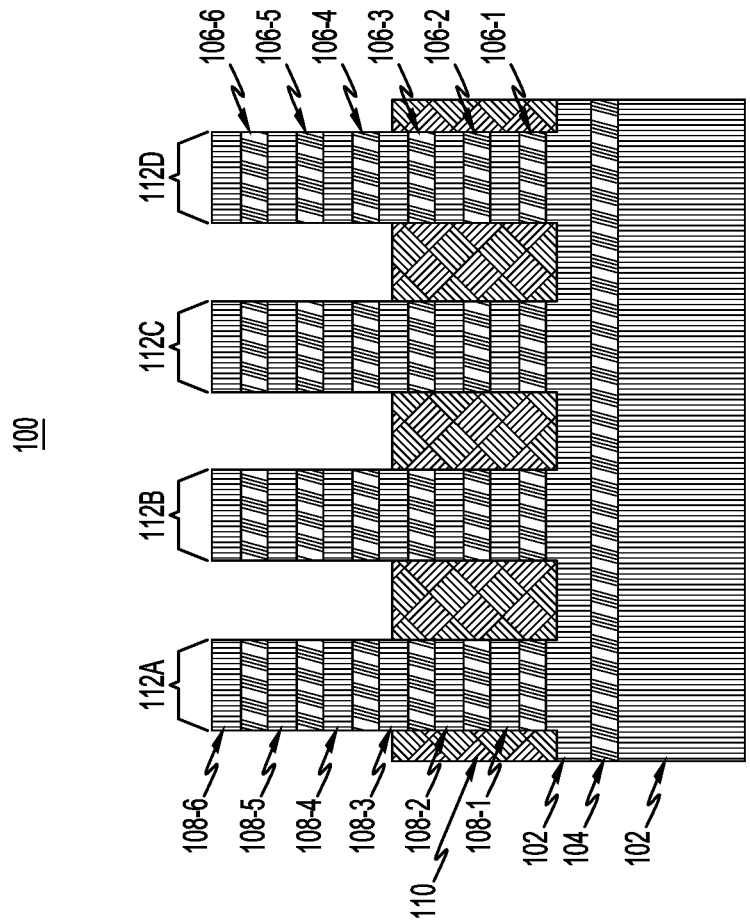
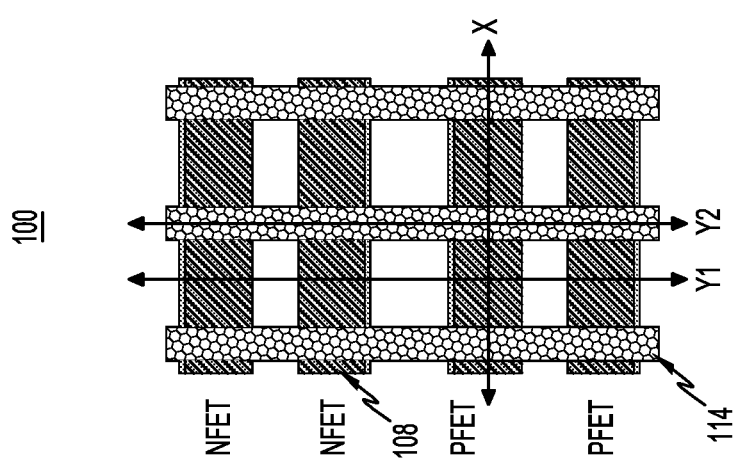
FIG. 2B
FIG. 2A

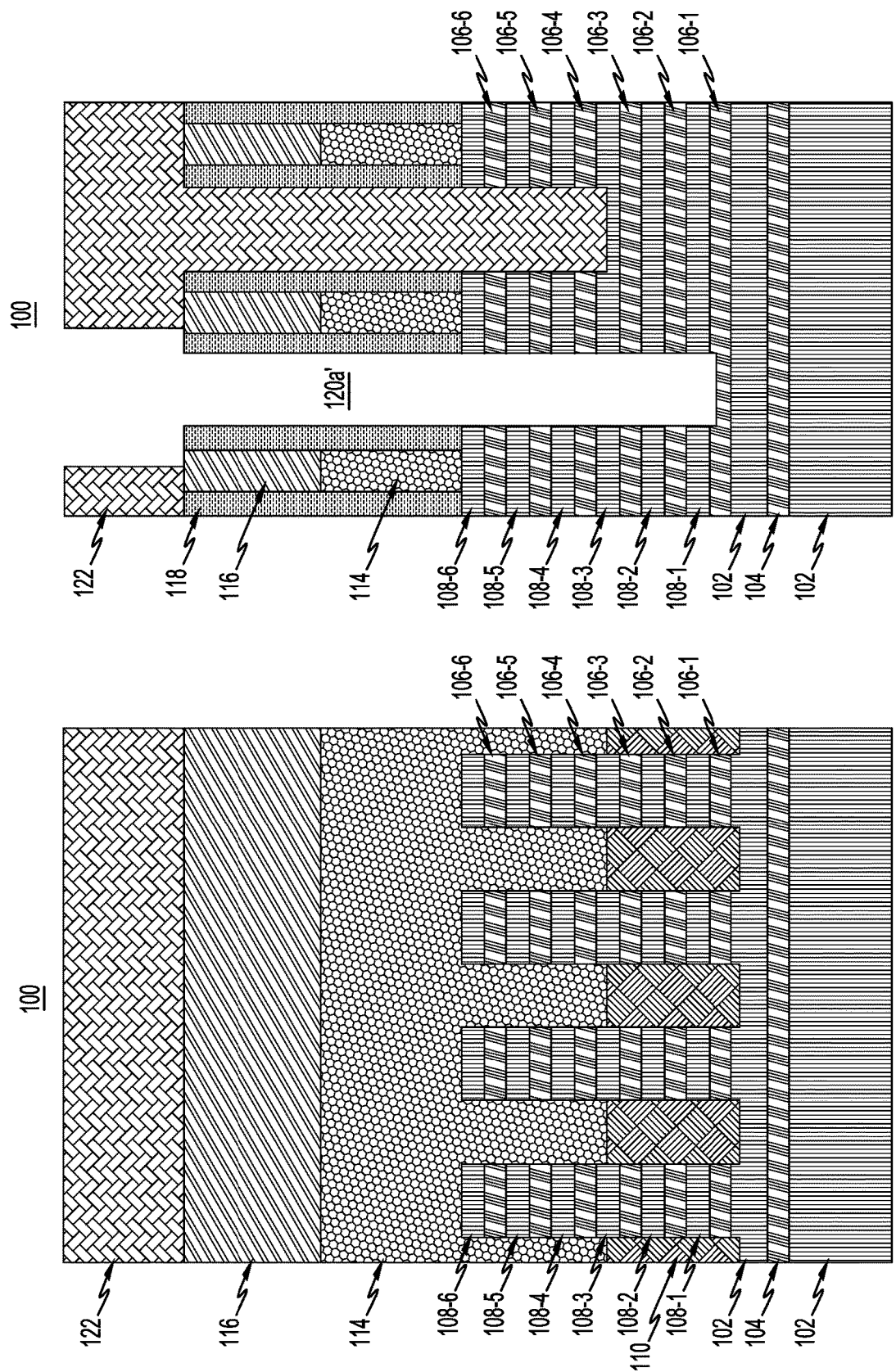

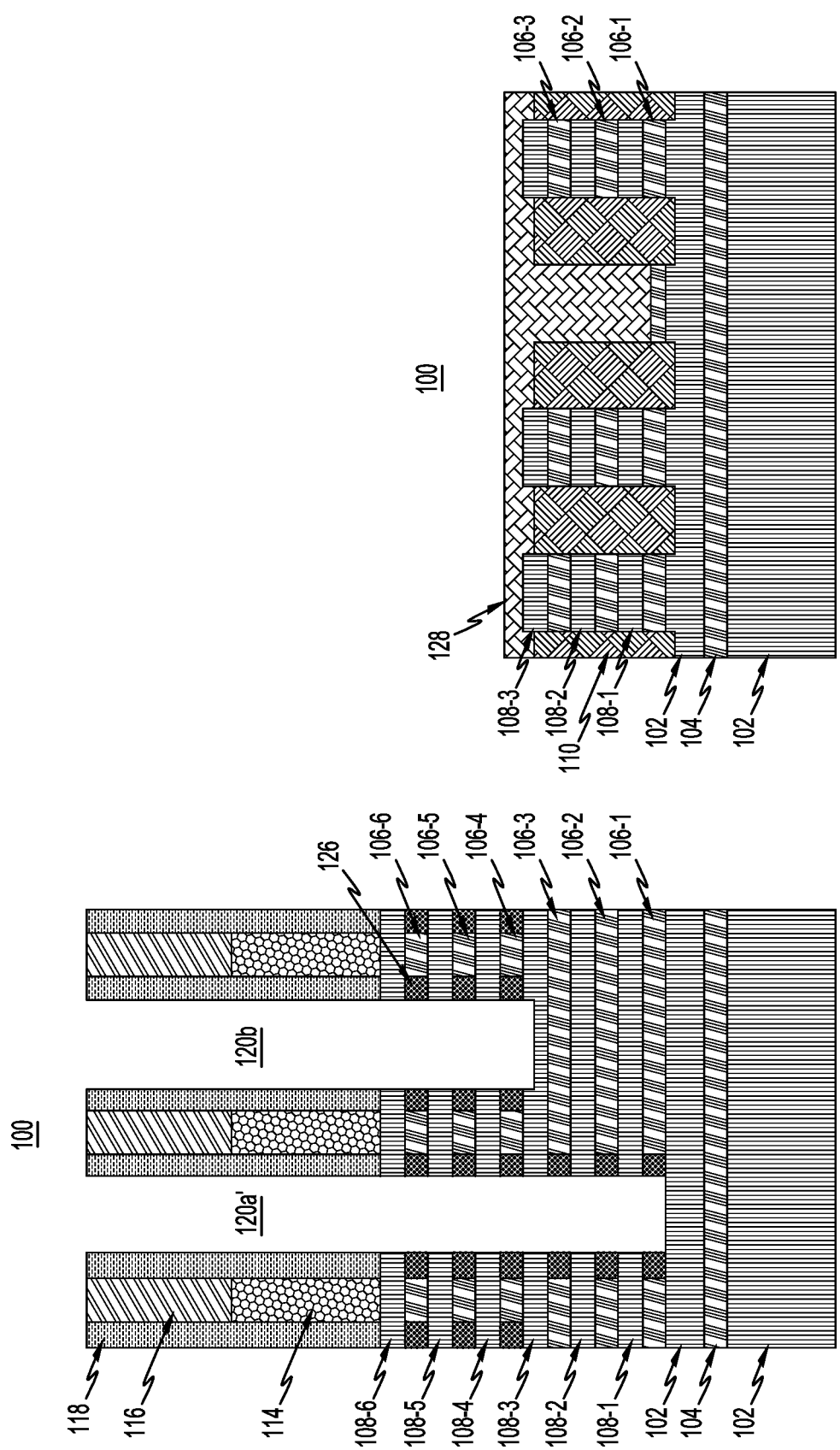

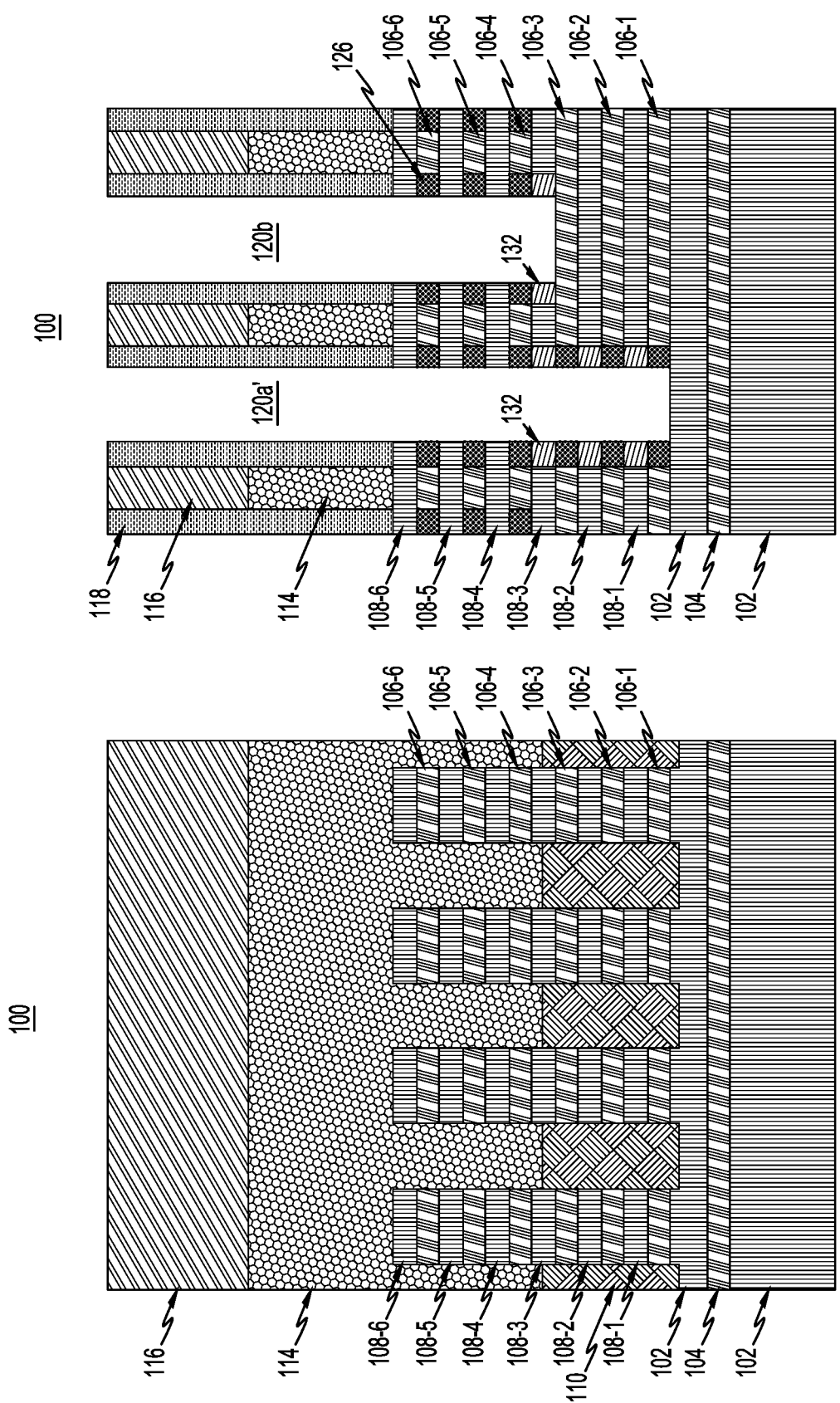

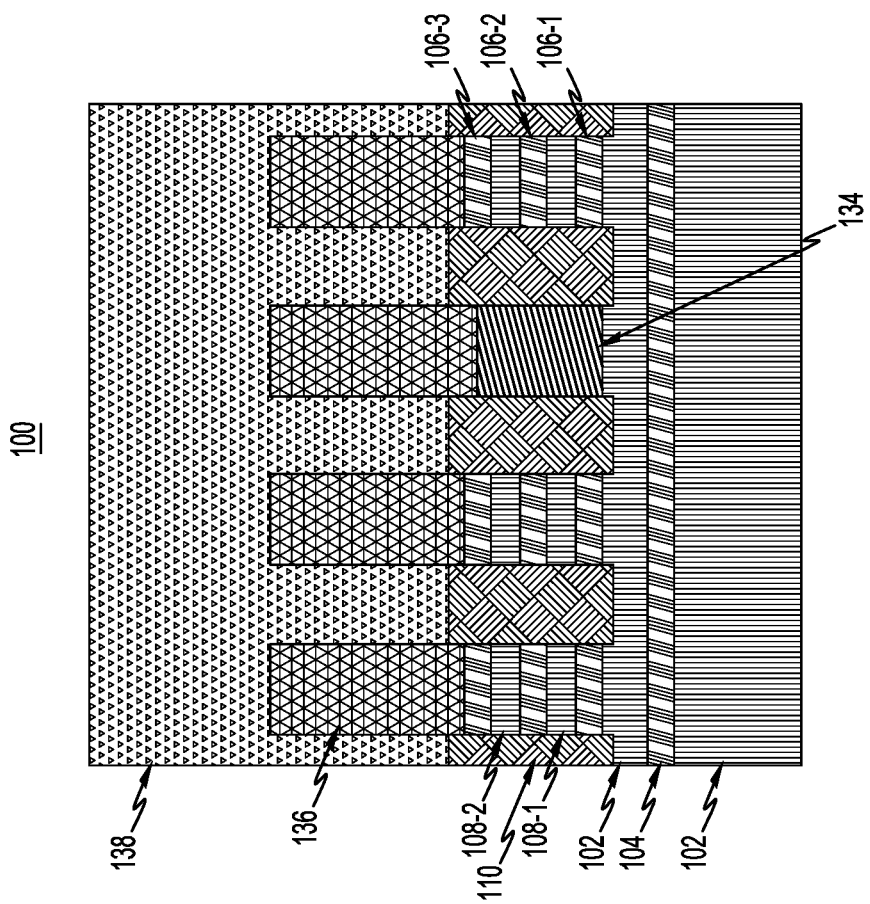
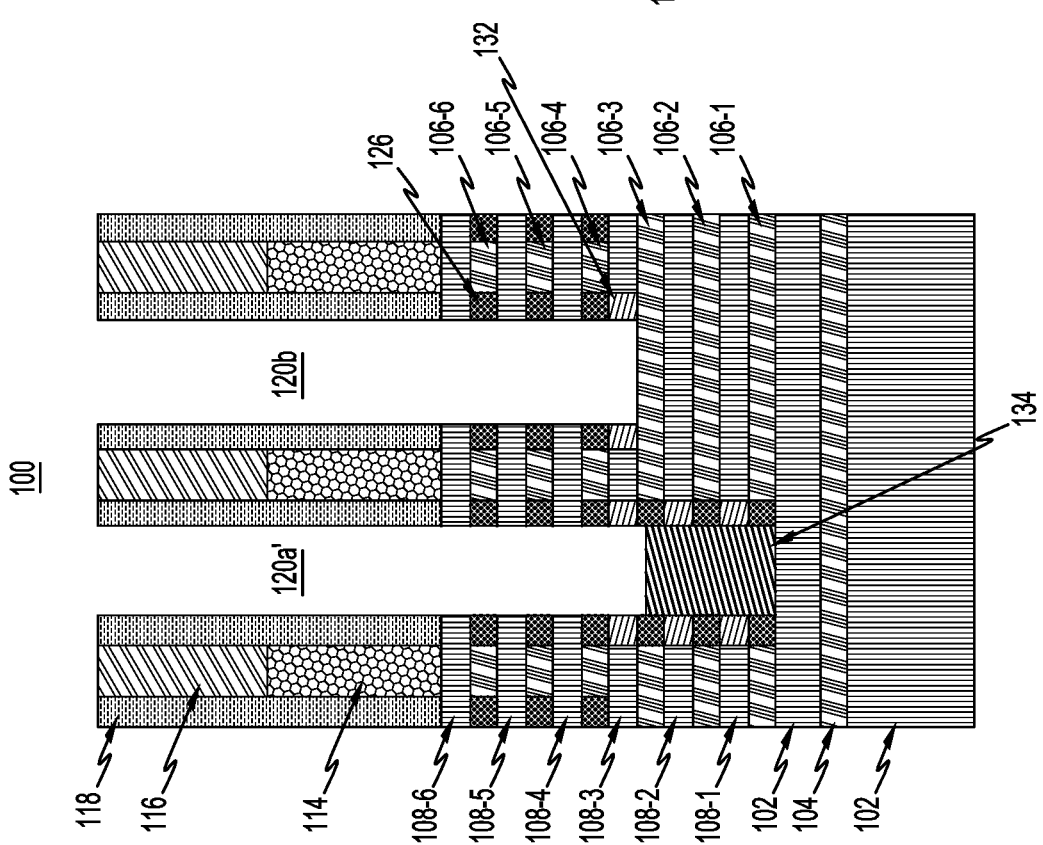

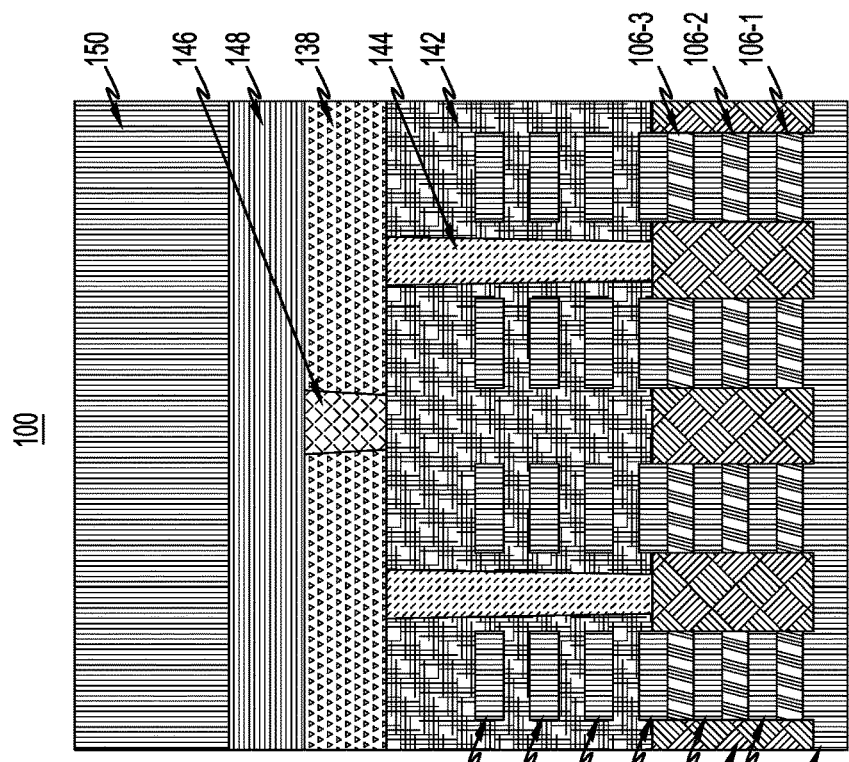
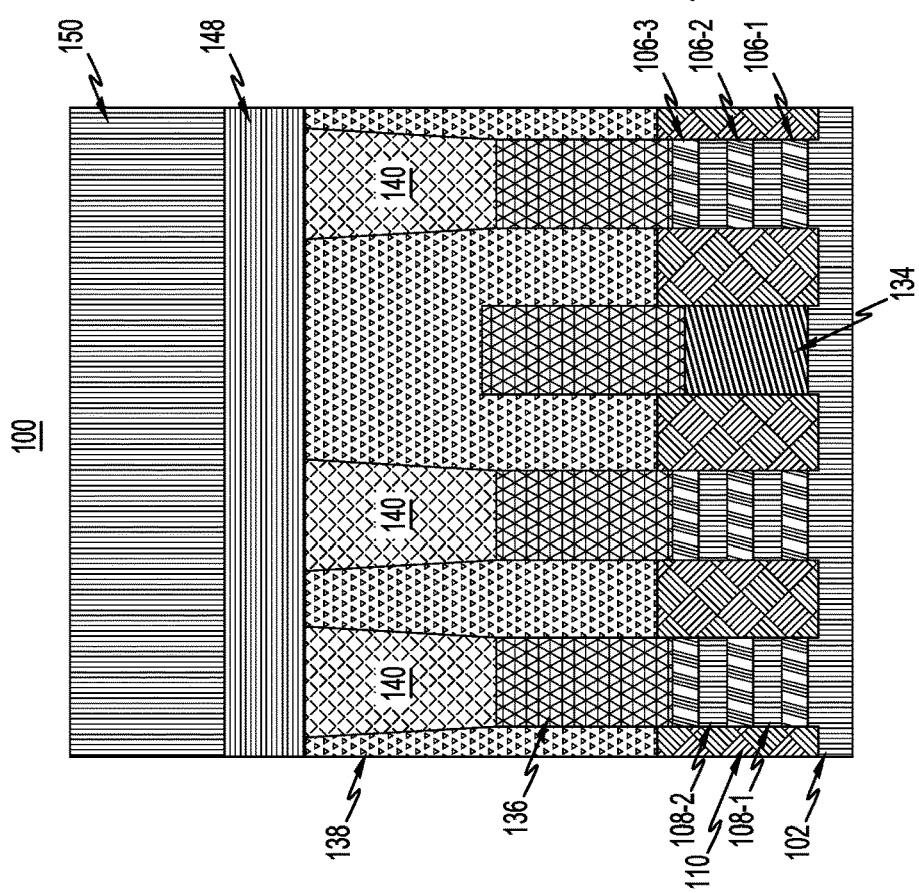
FIG. 13B
FIG. 13A

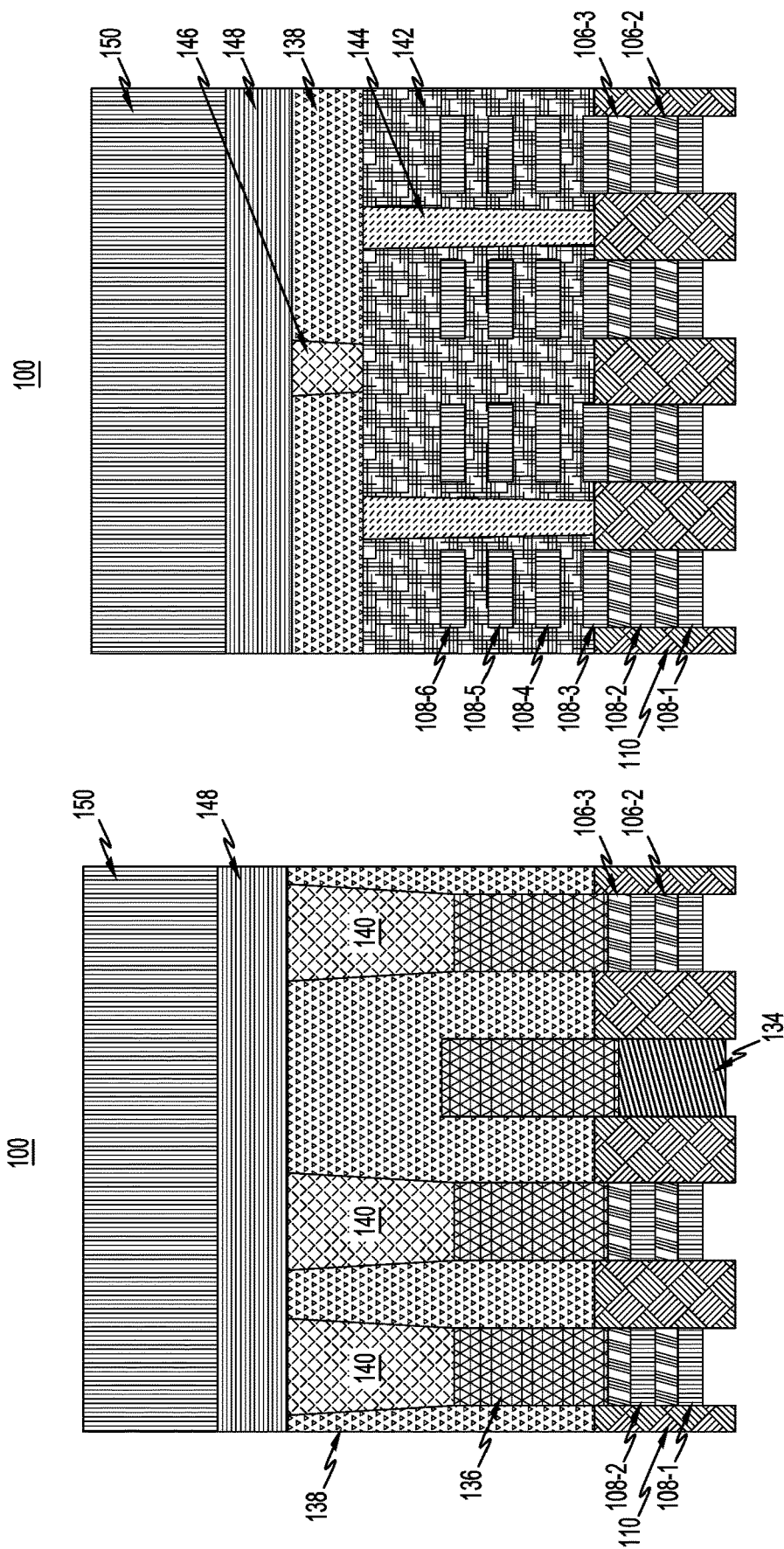

SEMICONDUCTOR STRUCTURE HAVING A BACKSIDE CONTACT WITH BACKSIDE SIDEWALL SPACERS

BACKGROUND

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor FETs (MOSFETs). Complementary MOS (CMOS) devices are widely used, where both n-type and p-type transistors (nFET and pFET) are used to form logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a source/drain region having a backside surface disposed in a backside interlayer dielectric layer, a backside contact disposed in the backside interlayer dielectric layer, backside sidewall spacers disposed between sidewalls of the backside interlayer dielectric layer and sidewalls of the backside contact and the backside surface of the source drain region; and a backside power rail connected to the source/drain region through the backside contact. The backside contact is disposed on the backside surface of the source/drain region.

The semiconductor structure of the illustrative embodiment advantageously allows for backside contact formation with backside sidewall spacers thereby avoiding the use of a bottom dielectric insulator layer.

In one or more additional illustrative embodiments, as may be combined with the preceding paragraphs, the semiconductor structure further comprises a first field-effect transistor disposed on the backside interlayer dielectric layer and a second field-effect transistor disposed on the backside interlayer dielectric layer and adjacent the first field-effect transistor.

In one or more additional illustrative embodiments, as may be combined with the preceding paragraphs, the first field-effect transistor comprises a first gate structure, and the second field-effect transistor comprises a second gate structure.

In one or more additional illustrative embodiments, as may be combined with the preceding paragraphs, the backside interlayer dielectric layer is in contact with the first gate structure and the second gate structure.

In one or more additional illustrative embodiments, as may be combined with the preceding paragraphs, a portion of the source/drain region extends above the backside interlayer dielectric layer and is located between the first field-effect transistor and the second field-effect transistor.

In one or more additional illustrative embodiments, as may be combined with the preceding paragraphs, the first field-effect transistor and the second field-effect transistor comprise respective nanosheet field-effect transistor devices.

In one or more additional illustrative embodiments, as may be combined with the preceding paragraphs, the backside sidewall spacers comprise multiple segments of a first sidewall spacer and a second sidewall spacer in an alternating pattern.

In one or more additional illustrative embodiments, as may be combined with the preceding paragraphs, the semiconductor structure further comprises a first nanosheet field-effect transistor disposed on the backside interlayer dielectric layer and a second nanosheet field-effect transistor disposed on the backside interlayer dielectric layer and adjacent the first nanosheet field-effect transistor. The first nanosheet field-effect transistor and the second nanosheet field-effect transistor comprise inner spacers that are composed of a segment of one of the first sidewall spacer and the second sidewall spacer.

In another exemplary embodiment, a semiconductor structure comprises a first source/drain region having a backside surface disposed in a backside interlayer dielectric layer, a second source/drain region disposed on the backside interlayer dielectric layer and located adjacent the first source/drain region, a backside contact disposed in the backside interlayer dielectric layer and in contact with the backside surface of the first source/drain region, and backside sidewall spacers disposed between sidewalls of the backside interlayer dielectric layer and sidewalls of the backside contact and the backside surface of the first source/drain region.

The semiconductor structure of the illustrative embodiment advantageously allows for backside contact formation with backside sidewall spacers thereby avoiding the use of a bottom dielectric insulator layer.

In one or more additional illustrative embodiments, as may be combined with the preceding paragraphs, the semiconductor structure further comprises a backside power rail connected to the first source/drain region through the backside contact.

In one or more additional illustrative embodiments, as may be combined with the preceding paragraphs, the semiconductor structure further comprises a first field-effect transistor disposed on the backside interlayer dielectric layer and a second field-effect transistor disposed on the backside interlayer dielectric layer and adjacent the first field-effect transistor.

In one or more additional illustrative embodiments, as may be combined with the preceding paragraphs, the first field-effect transistor comprises a first gate structure, and the second field-effect transistor comprises a second gate structure.

In one or more additional illustrative embodiments, as may be combined with the preceding paragraphs, the backside interlayer dielectric layer is in contact with the first gate structure and the second gate structure.

In one or more additional illustrative embodiments, as may be combined with the preceding paragraphs, a portion of the first source/drain region extends above the backside interlayer dielectric layer and is located between the first field-effect transistor and the second field-effect transistor.

In one or more additional illustrative embodiments, as may be combined with the preceding paragraphs, the first field-effect transistor and the second field-effect transistor comprise respective nanosheet field-effect transistor devices.

In one or more additional illustrative embodiments, as may be combined with the preceding paragraphs, the backside sidewall spacers comprise multiple segments of a first sidewall spacer and a second sidewall spacer in an alternating pattern.

Another exemplary embodiment comprises an integrated circuit comprising one or more semiconductor devices. At least one of the one or more semiconductor devices is a semiconductor device according to one or more of the foregoing illustrative embodiments.

The integrated circuit of the illustrative embodiment advantageously allows for semiconductor structures formed with a backside contact having backside sidewall spacers thereby avoiding the use of a bottom dielectric insulator layer.

Other embodiments will be described in the following detailed description of embodiments, which is to be read in conjunction with the accompanying figures.

BRIEF DESCRIPTION OF THE DRAWINGS

FIG. 2A is a top view of a semiconductor structure at a second-intermediate fabrication stage, according to an illustrative embodiment.

FIG. 2B depicts a side cross-sectional view of the semiconductor structure taken along the Y1-Y1 axis of FIG. 2A for use at the second-intermediate fabrication stage, according to an illustrative embodiment.

FIG. 4B depicts a side cross-sectional view of the semiconductor structure taken along the Y2-Y2 axis of FIG. 2A for use at the fourth-intermediate fabrication stage, according to an illustrative embodiment.

FIG. 4C depicts a side cross-sectional view of the semiconductor structure taken along the X-X axis of FIG. 2A for use at the fourth-intermediate fabrication stage, according to an illustrative embodiment.

FIG. 5C depicts a side cross-sectional view of the semiconductor structure taken along the X-X axis of FIG. 2A for use at the fifth-intermediate fabrication stage, according to an illustrative embodiment.

FIG. 6A depicts a side cross-sectional view of the semiconductor structure taken along the Y1-Y1 axis of FIG. 2A for use at a sixth-intermediate fabrication stage, according to an illustrative embodiment.

FIG. 8B depicts a side cross-sectional view of the semiconductor structure taken along the Y2-Y2 axis of FIG. 2A for use at the eighth-intermediate fabrication stage, according to an illustrative embodiment.

FIG. 8C depicts a side cross-sectional view of the semiconductor structure taken along the X-X axis of FIG. 2A for use at the eighth-intermediate fabrication stage, according to an illustrative embodiment.

FIG. 9C depicts a side cross-sectional view of the semiconductor structure taken along the X-X axis of FIG. 2A for use at the ninth-intermediate fabrication stage, according to an illustrative embodiment.

FIG. 10A depicts a side cross-sectional view of the semiconductor structure taken along the Y1-Y1 axis of FIG. 2A for use at a tenth-intermediate fabrication stage, according to an illustrative embodiment.

2A for use at an eleventh-intermediate fabrication stage, according to an illustrative embodiment.

Figure 11B:
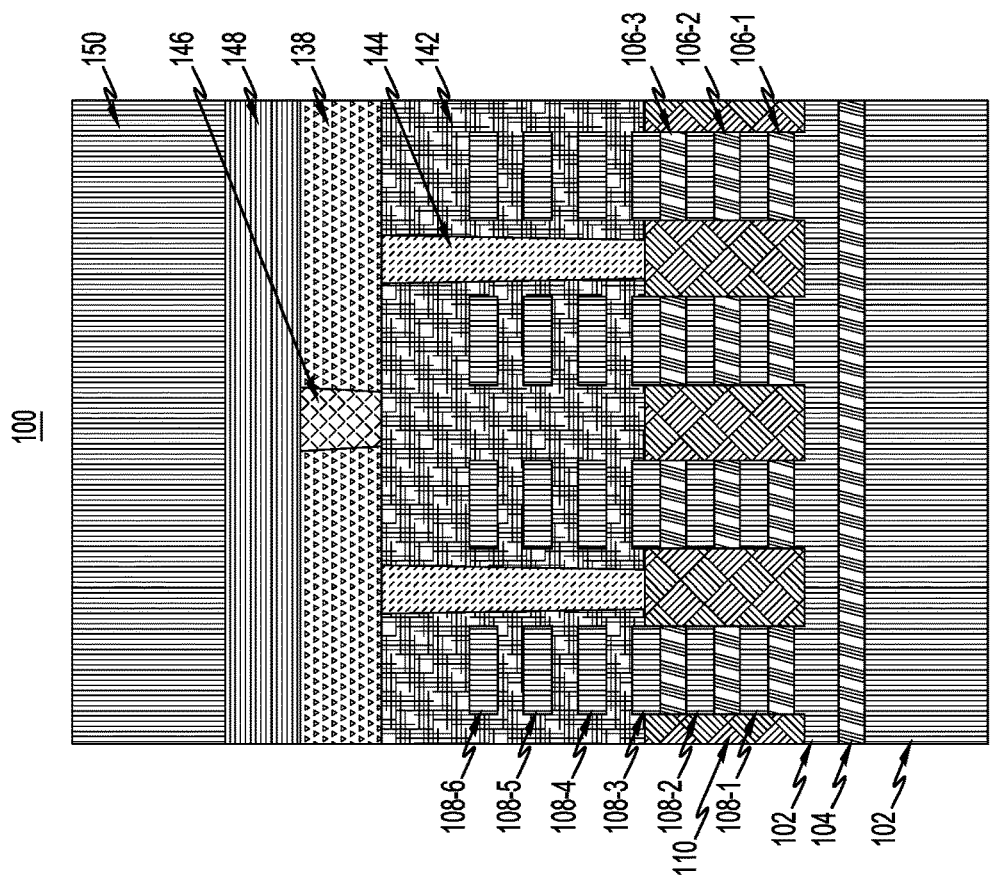
FIG. 11A depicts a side cross-sectional view of the semiconductor structure taken along the Y1-Y1 axis of FIG.

FIG. 11B depicts a side cross-sectional view of the semiconductor structure taken along the Y2-Y2 axis of FIG. 2A for use at the eleventh-intermediate fabrication stage, according to an illustrative embodiment.

Figure 11A:
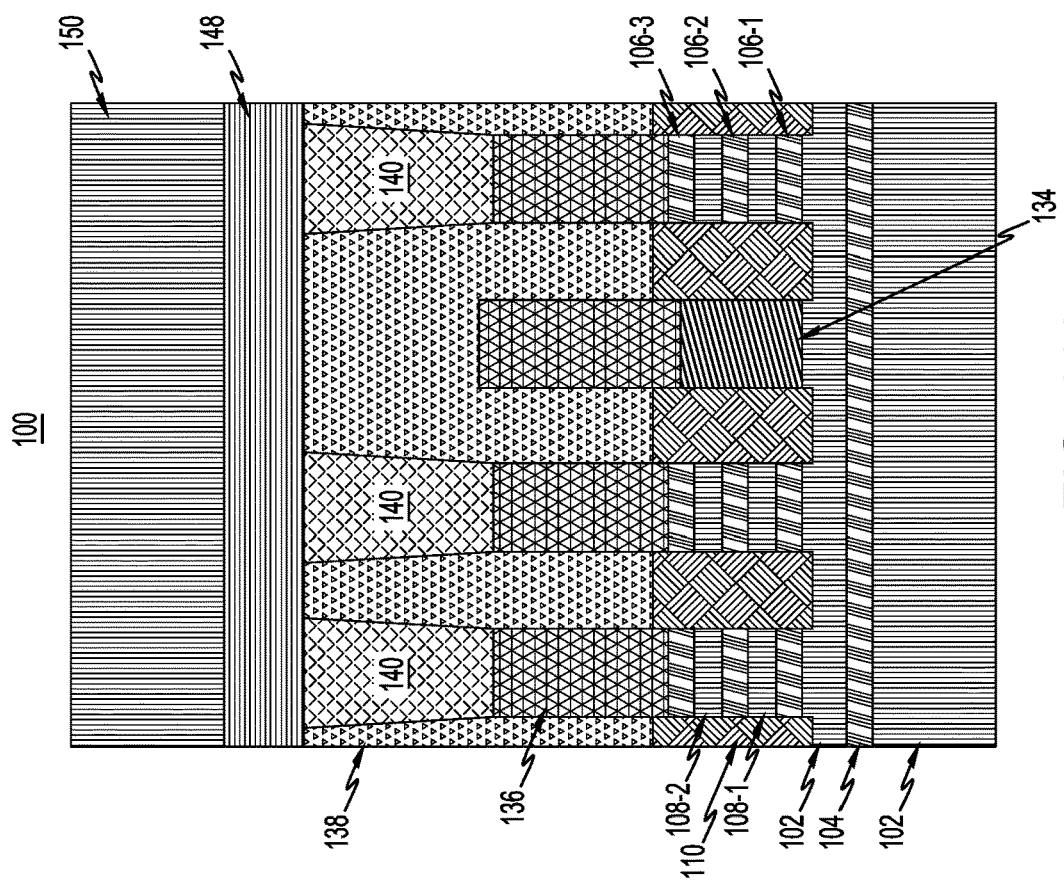
Figure 11C:
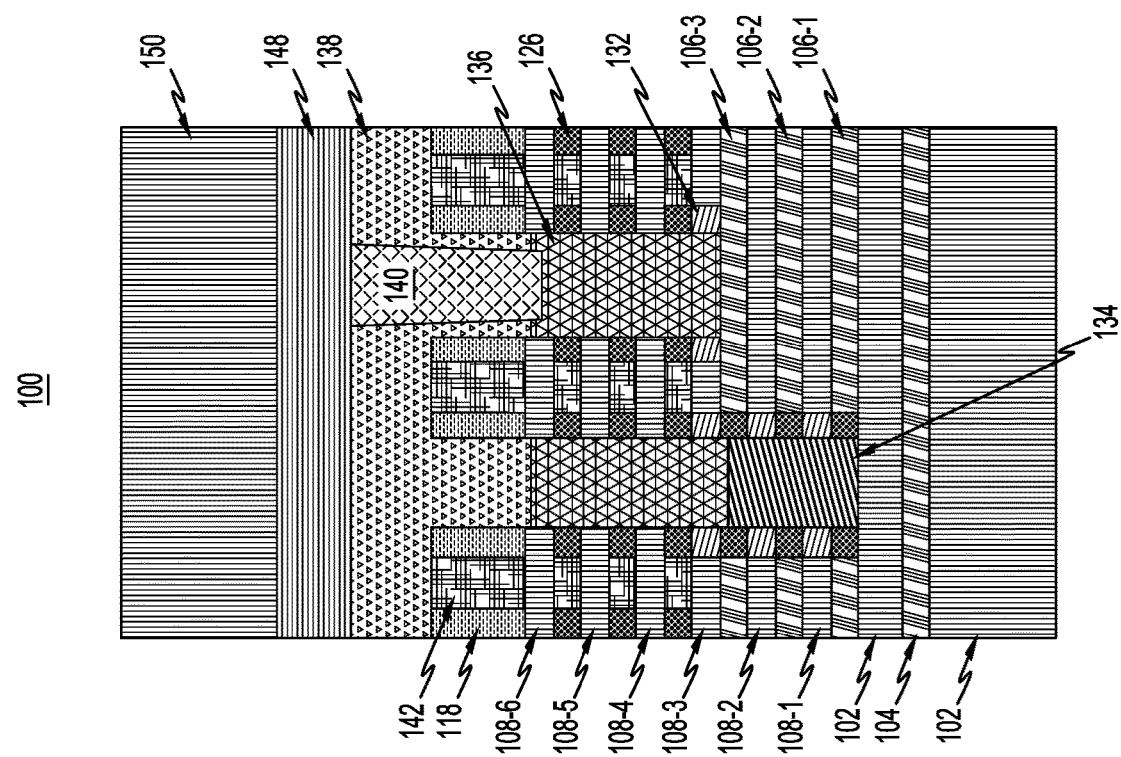

FIG. 11C depicts a side cross-sectional view of the semiconductor structure taken along the X-X axis of FIG. 2A for use at the eleventh-intermediate fabrication stage, according to an illustrative embodiment.

Figure 12A:
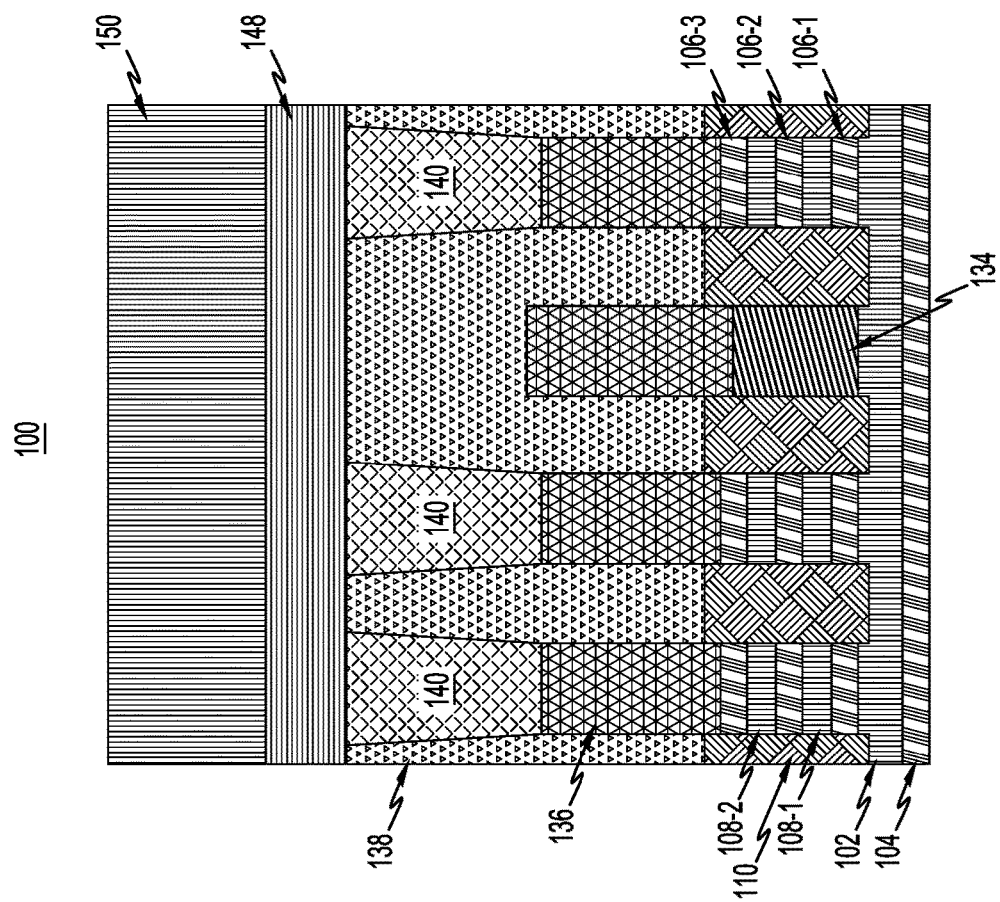

FIG. 12A depicts a side cross-sectional view of the semiconductor structure taken along the Y1-Y1 axis of FIG. 2A for use at a twelfth-intermediate fabrication stage, according to an illustrative embodiment.

Figures 12B, 12C:
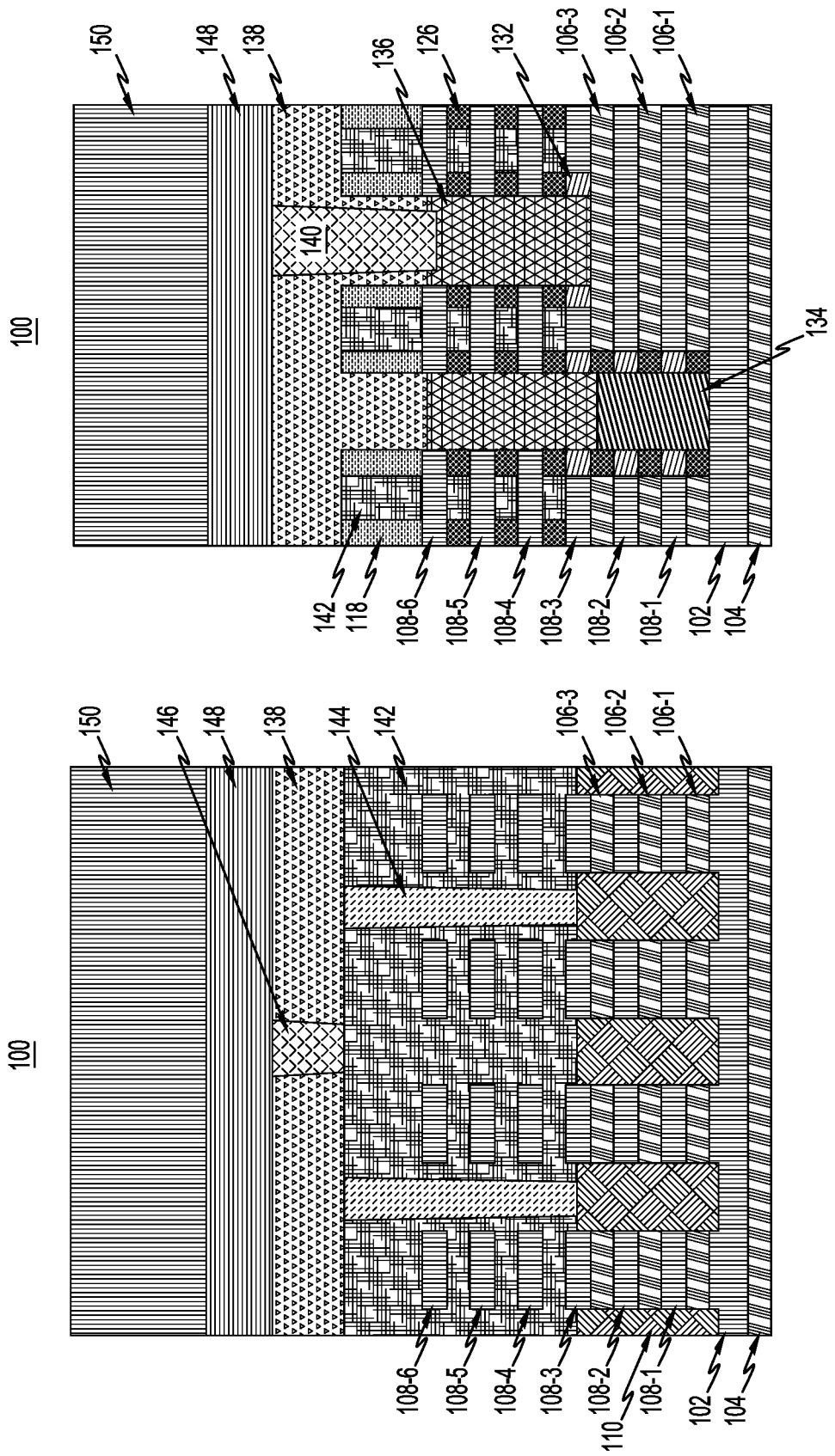

FIG. 12B depicts a side cross-sectional view of the semiconductor structure taken along the Y2-Y2 axis of FIG. 2A for use at the twelfth-intermediate fabrication stage, according to an illustrative embodiment.

FIG. 12C depicts a side cross-sectional view of the semiconductor structure taken along the X-X axis of FIG. 2A for use at the twelfth-intermediate fabrication stage, according to an illustrative embodiment.

FIG. 13A depicts a side cross-sectional view of the semiconductor structure taken along the Y1-Y1 axis of FIG. 2A for use at a thirteenth-intermediate fabrication stage, according to an illustrative embodiment.

FIG. 13B depicts a side cross-sectional view of the semiconductor structure taken along the Y2-Y2 axis of FIG. 2A for use at the thirteenth-intermediate fabrication stage, according to an illustrative embodiment.

Figure 13C:
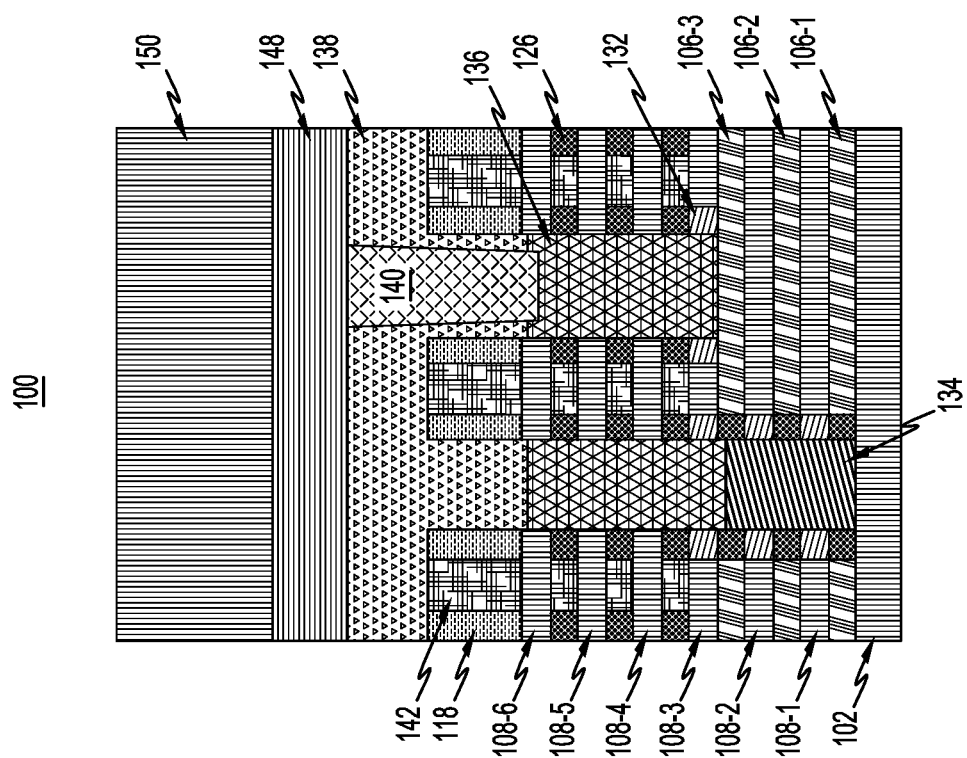

FIG. 13C depicts a side cross-sectional view of the semiconductor structure taken along the X-X axis of FIG. 2A for use at the thirteenth-intermediate fabrication stage, according to an illustrative embodiment.

Figure 14A:
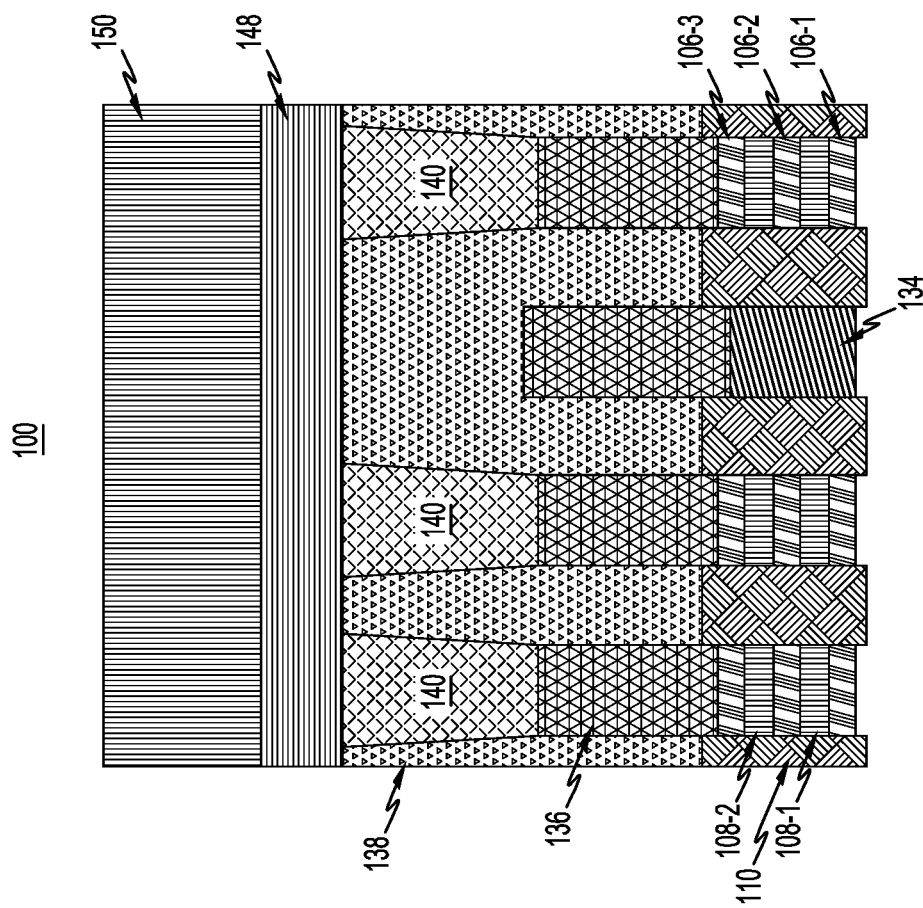

FIG. 14A depicts a side cross-sectional view of the semiconductor structure taken along the Y1-Y1 axis of FIG. 2A for use at a fourteenth-intermediate fabrication stage, according to an illustrative embodiment.

Figure 14C:
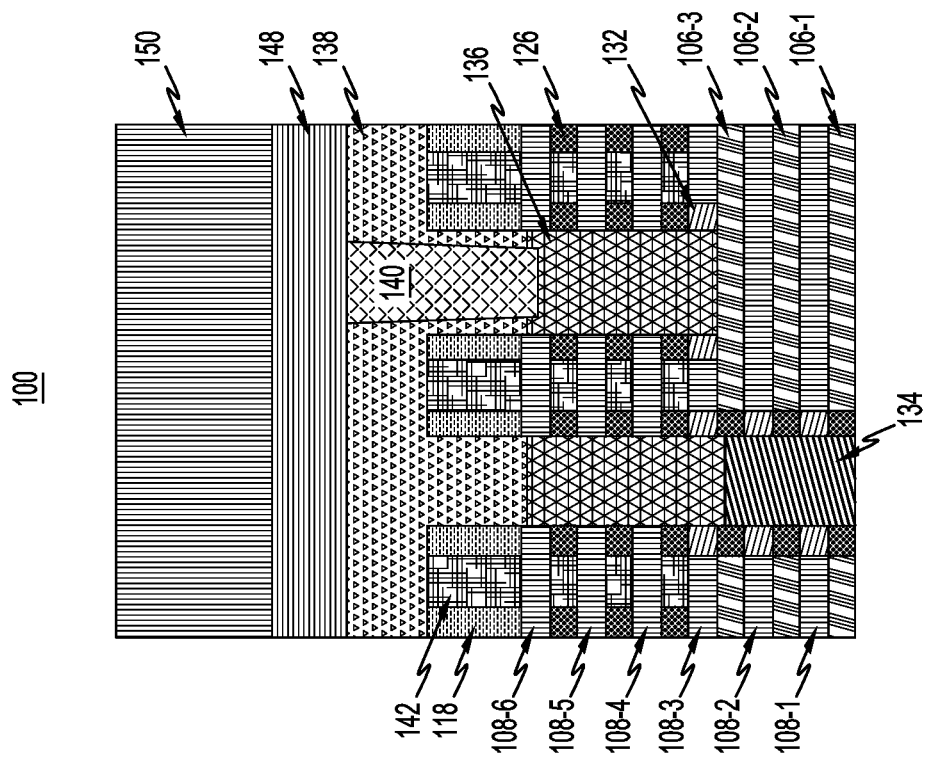
Figure 14B:
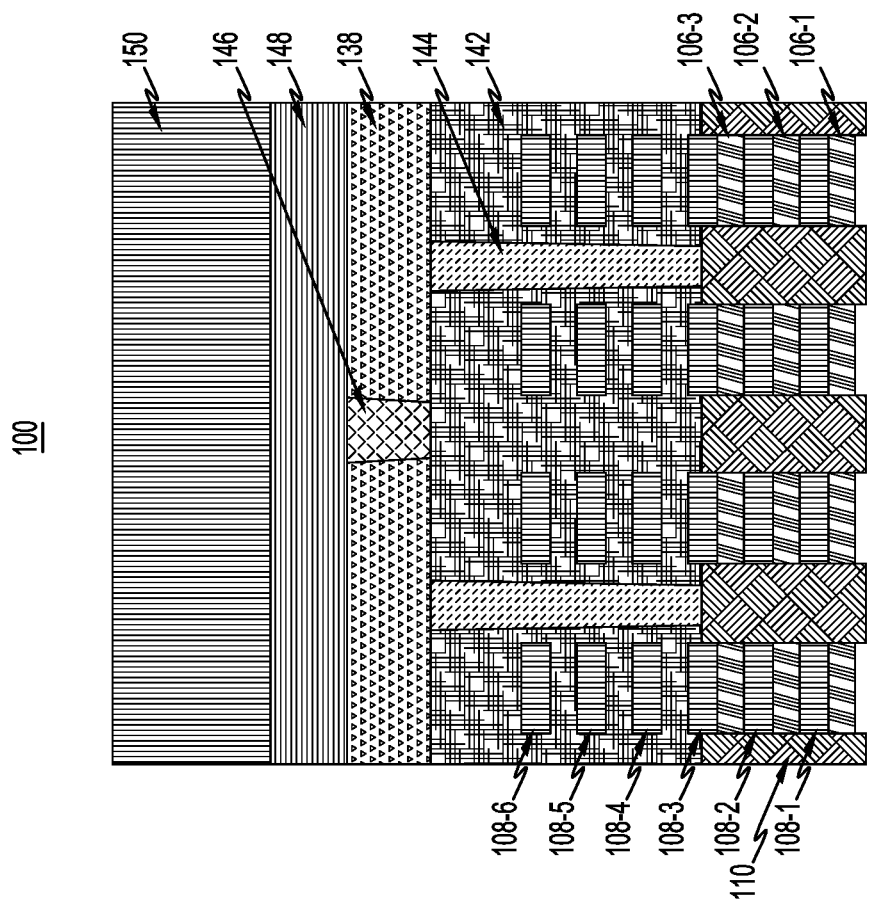

FIG. 14B depicts a side cross-sectional view of the semiconductor structure taken along the Y2-Y2 axis of FIG. 2A for use at the fourteenth-intermediate fabrication stage, according to an illustrative embodiment.

FIG. 14C depicts a side cross-sectional view of the semiconductor structure taken along the X-X axis of FIG. 2A for use at the fourteenth-intermediate fabrication stage, according to an illustrative embodiment.

FIG. 15A depicts a side cross-sectional view of the semiconductor structure taken along the Y1-Y1 axis of FIG. 2A for use at a fifteenth-intermediate fabrication stage, according to an illustrative embodiment.

FIG. 15B depicts a side cross-sectional view of the semiconductor structure taken along the Y2-Y2 axis of FIG. 2A for use at the fifteenth-intermediate fabrication stage, according to an illustrative embodiment.

Figure 15C:
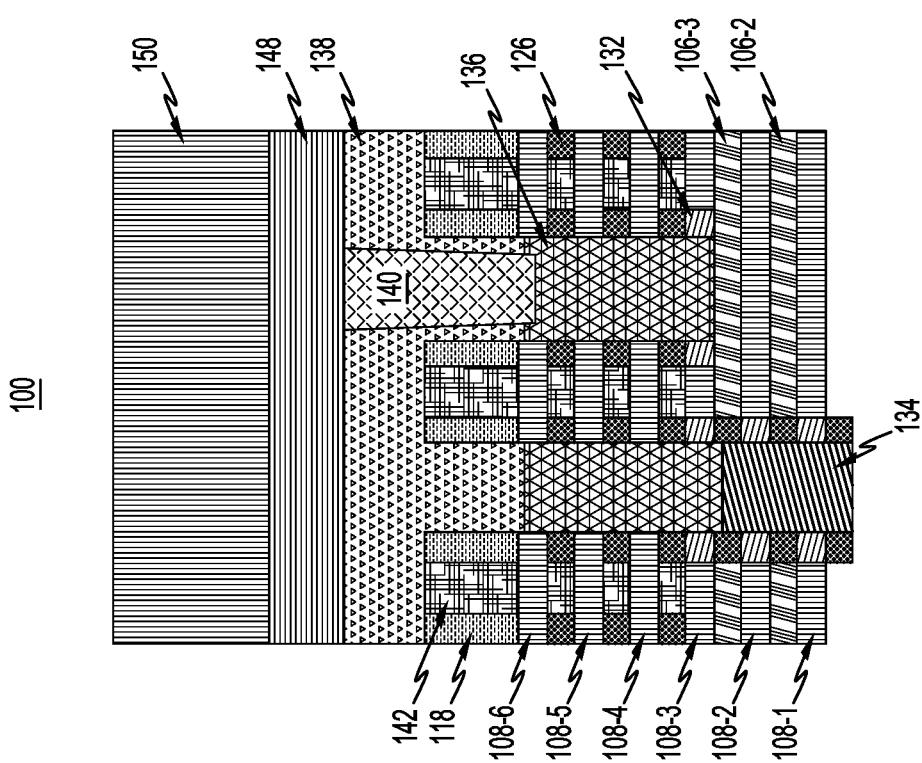

FIG. 15C depicts a side cross-sectional view of the semiconductor structure taken along the X-X axis of FIG. 2A for use at the fifteenth-intermediate fabrication stage, according to an illustrative embodiment.

Figure 16A:
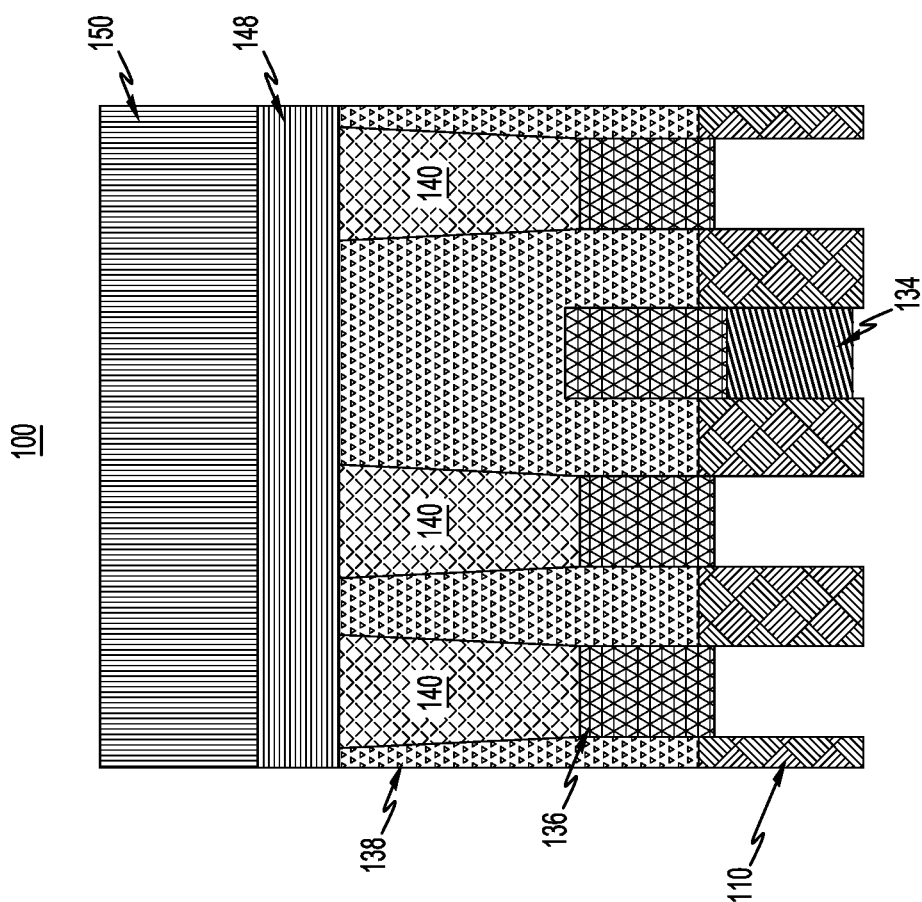

FIG. 16A depicts a side cross-sectional view of the semiconductor structure taken along the Y1-Y1 axis of FIG. 2A for use at a sixteenth-intermediate fabrication stage, according to an illustrative embodiment.

Figure 16C:
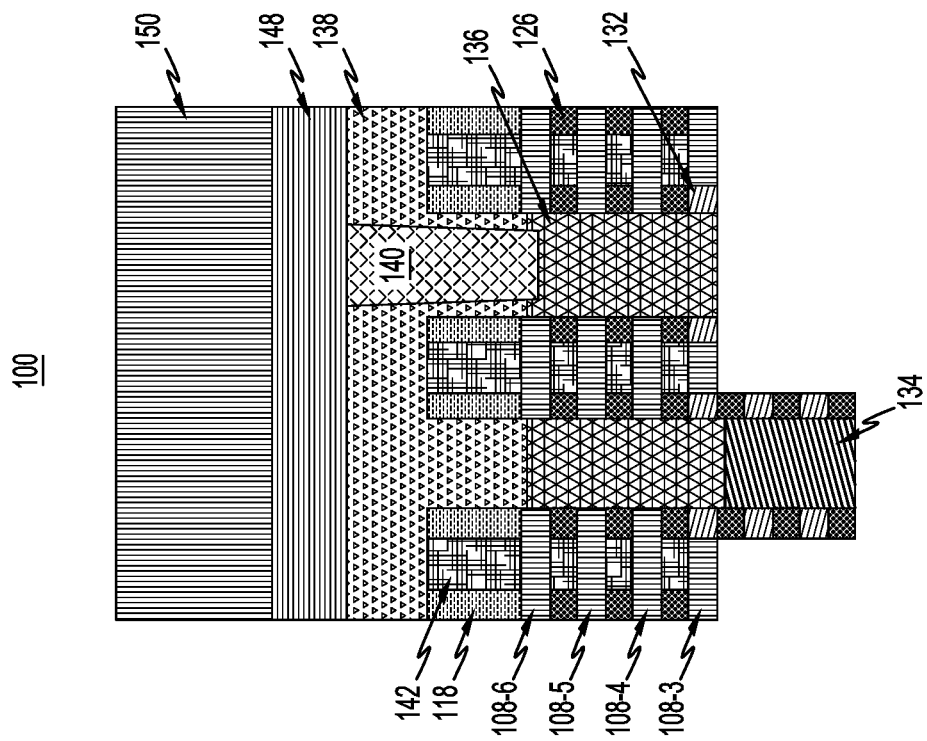
Figure 16B:
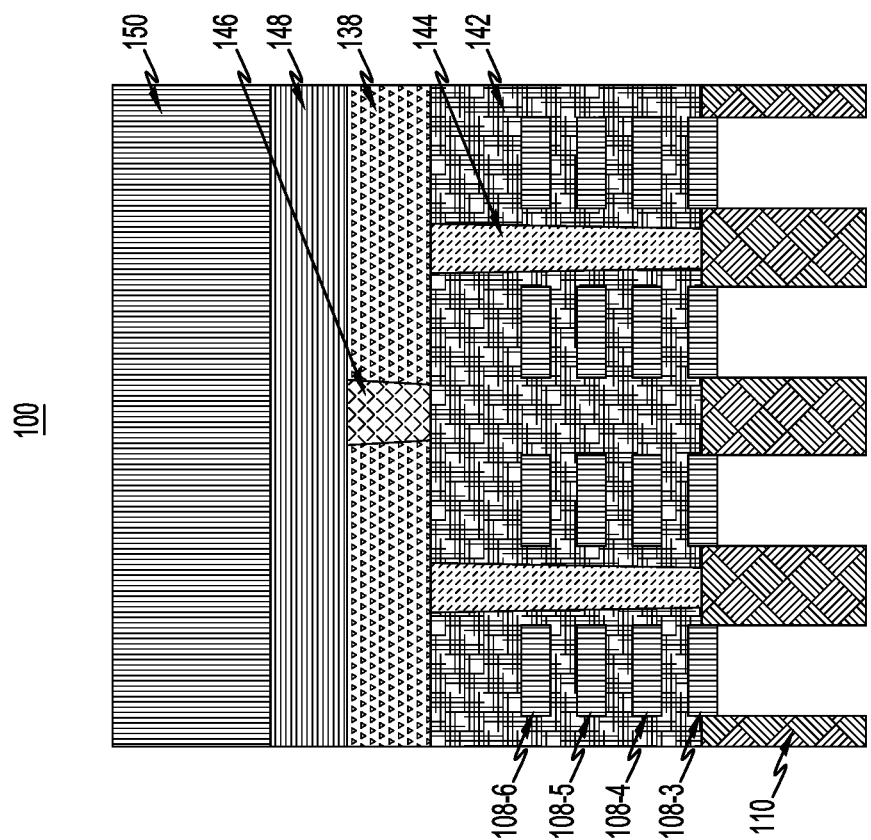

FIG. 16B depicts a side cross-sectional view of the semiconductor structure taken along the Y2-Y2 axis of FIG. 2A for use at the sixteenth-intermediate fabrication stage, according to an illustrative embodiment.

FIG. 16C depicts a side cross-sectional view of the semiconductor structure taken along the X-X axis of FIG. 2A for use at the sixteenth-intermediate fabrication stage, according to an illustrative embodiment.

Figure 17B:
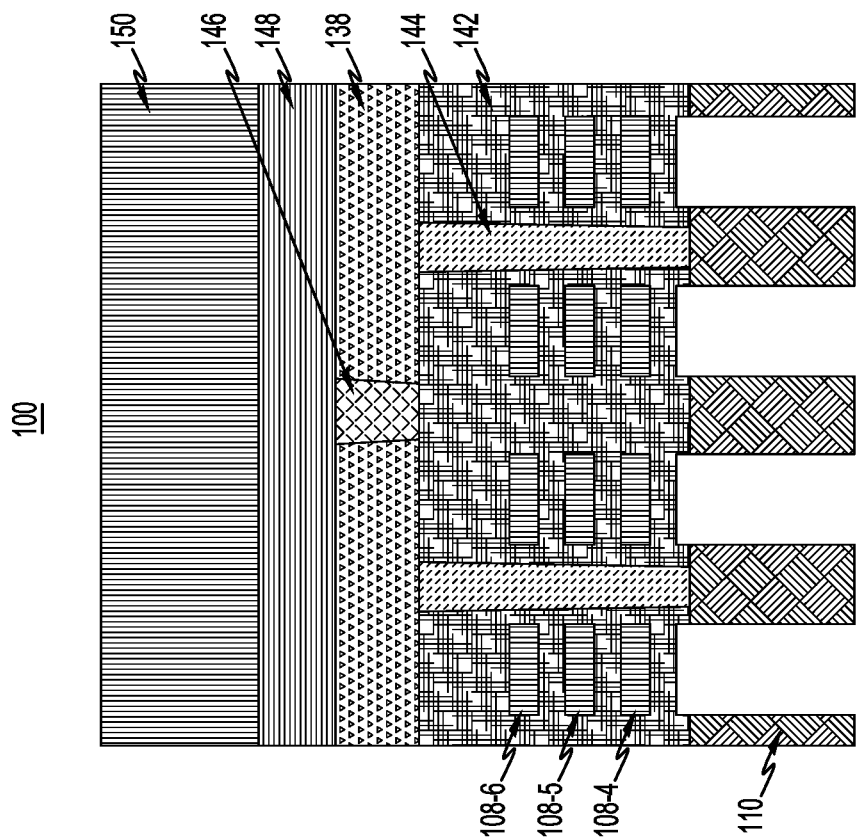
Figure 17A:
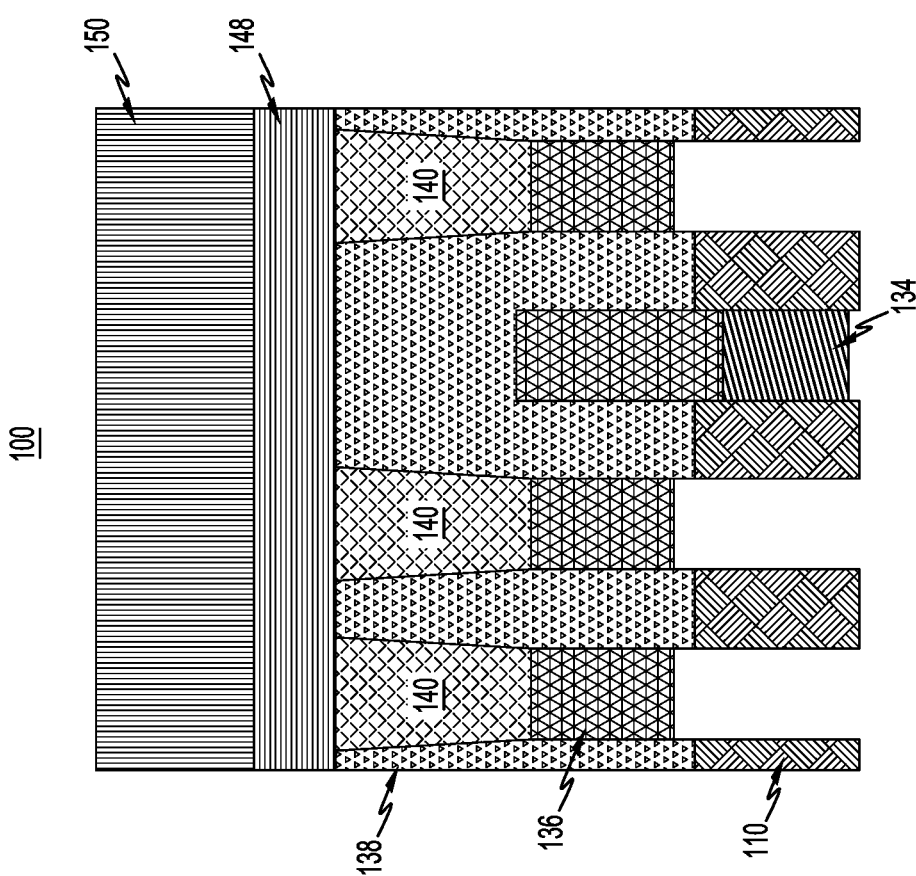

FIG. 17A depicts a side cross-sectional view of the semiconductor structure taken along the Y1-Y1 axis of FIG. 2A for use at a seventeenth-intermediate fabrication stage, according to an illustrative embodiment.

FIG. 17B depicts a side cross-sectional view of the semiconductor structure taken along the Y2-Y2 axis of FIG. 2A for use at the seventeenth-intermediate fabrication stage, according to an illustrative embodiment.

Figure 17C:
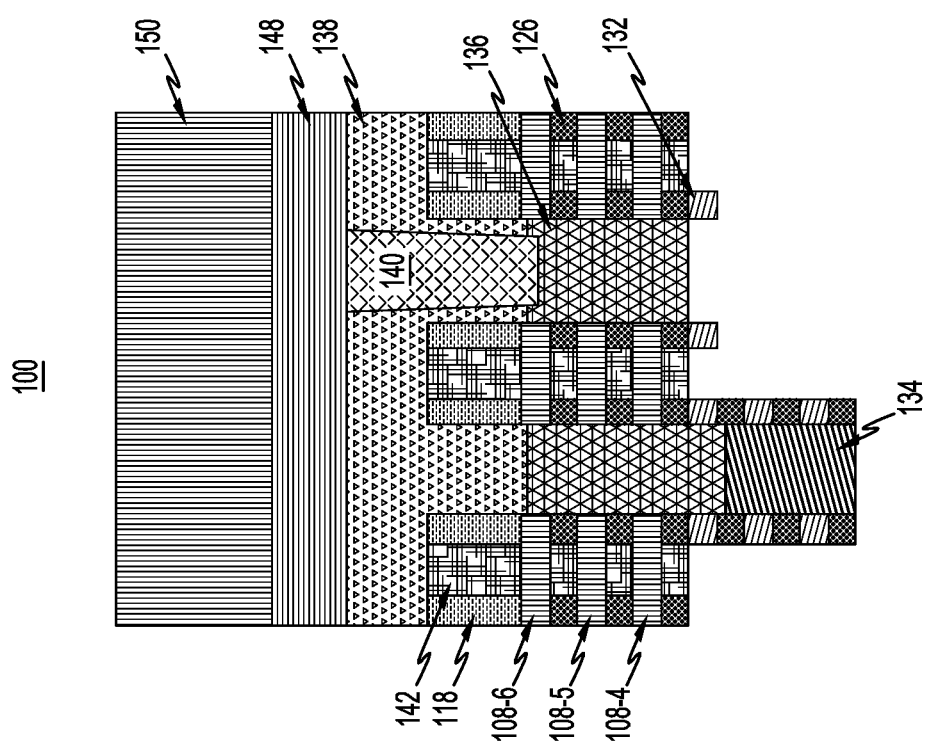

FIG. 17C depicts a side cross-sectional view of the semiconductor structure taken along the X-X axis of FIG. 2A for use at the seventeenth-intermediate fabrication stage, according to an illustrative embodiment.

Figure 18A:
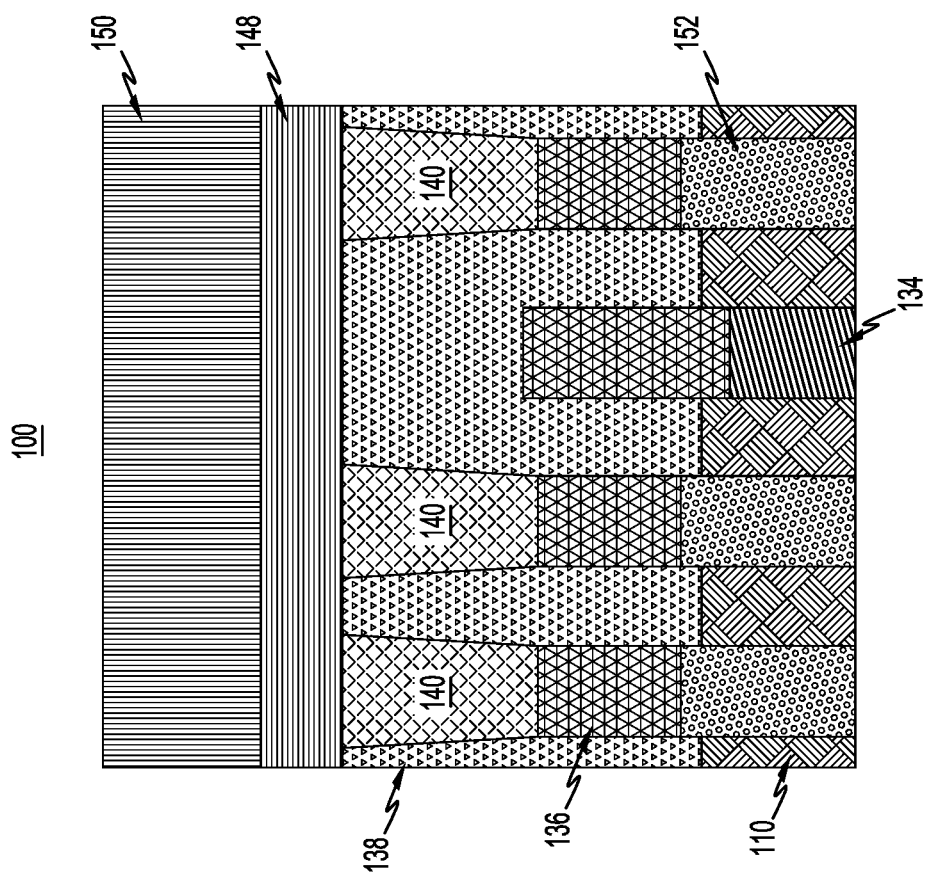

FIG. 18A depicts a side cross-sectional view of the semiconductor structure taken along the Y1-Y1 axis of FIG. 2A for use at an eighteenth-intermediate fabrication stage, according to an illustrative embodiment.

Figure 18C:
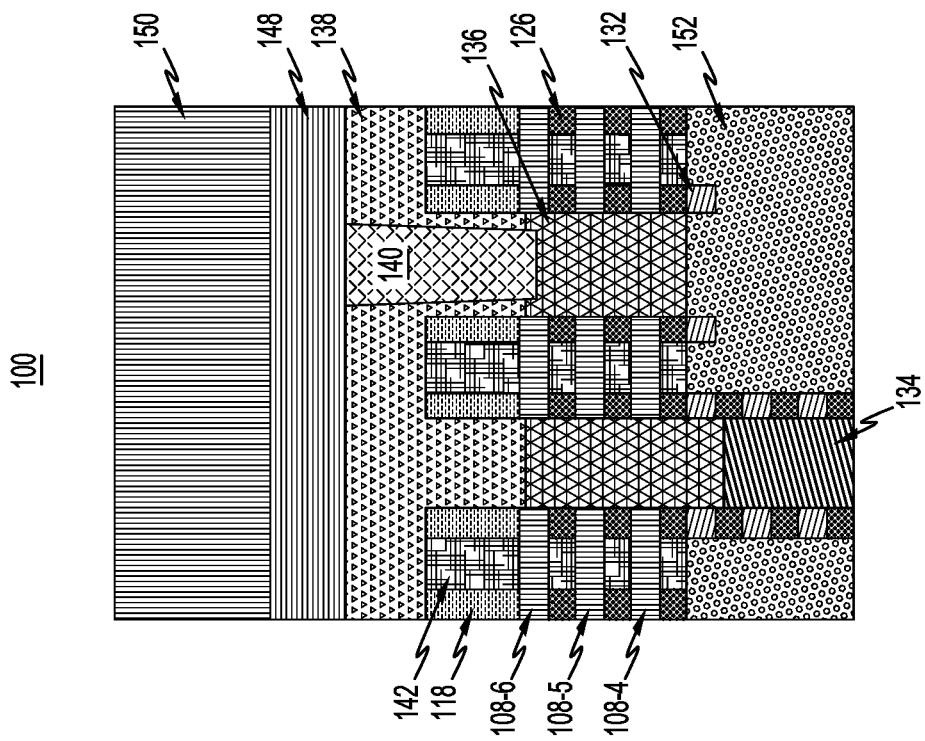
Figure 18B:
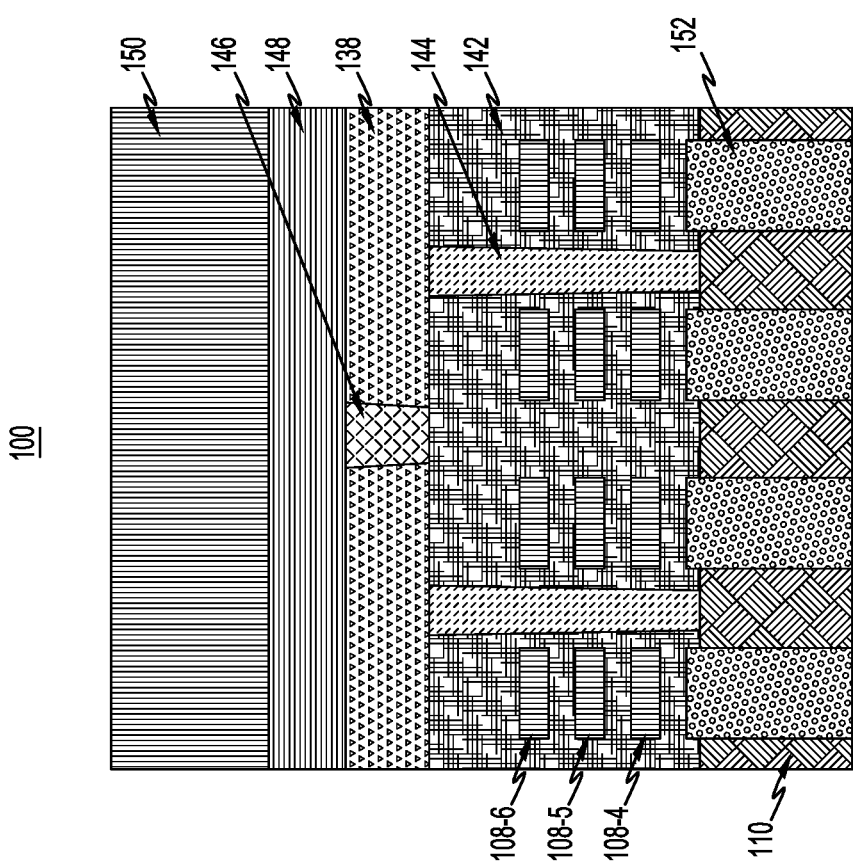

FIG. 18B depicts a side cross-sectional view of the semiconductor structure taken along the Y2-Y2 axis of FIG. 2A for use at the eighteenth-intermediate fabrication stage, according to an illustrative embodiment.

FIG. 18C depicts a side cross-sectional view of the semiconductor structure taken along the X-X axis of FIG. 2A for use at the eighteenth-intermediate fabrication stage, according to an illustrative embodiment.

Figure 19B:
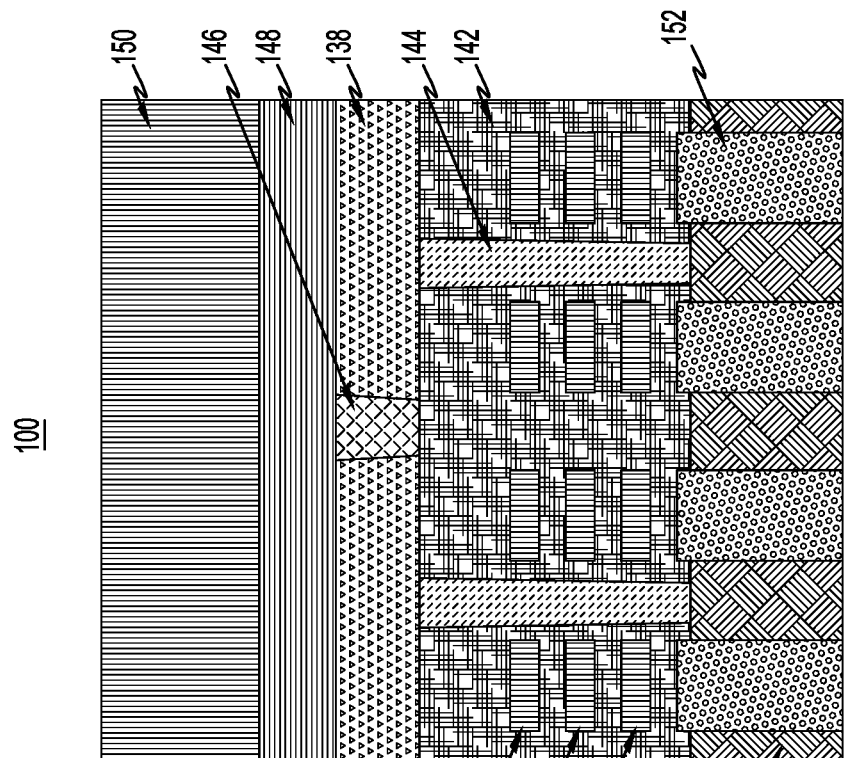
Figure 19A:
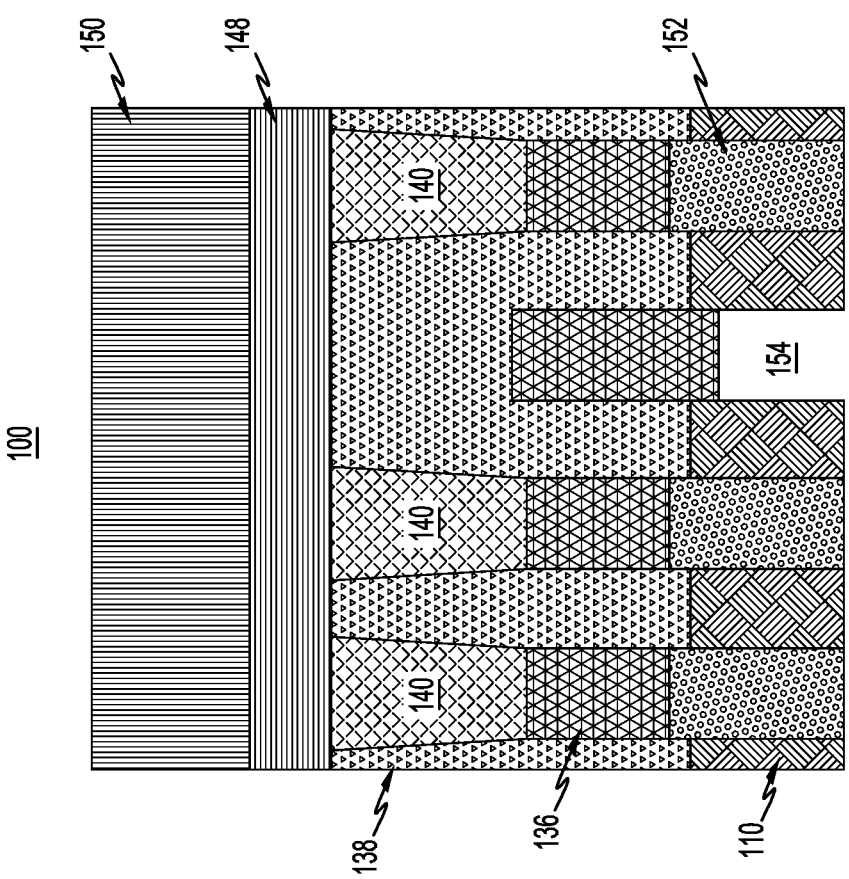

FIG. 19A depicts a side cross-sectional view of the semiconductor structure taken along the Y1-Y1 axis of FIG. 2A for use at a nineteenth-intermediate fabrication stage, according to an illustrative embodiment.

FIG. 19B depicts a side cross-sectional view of the semiconductor structure taken along the Y2-Y2 axis of FIG. 2A for use at the nineteenth-intermediate fabrication stage, according to an illustrative embodiment.

Figure 19C:
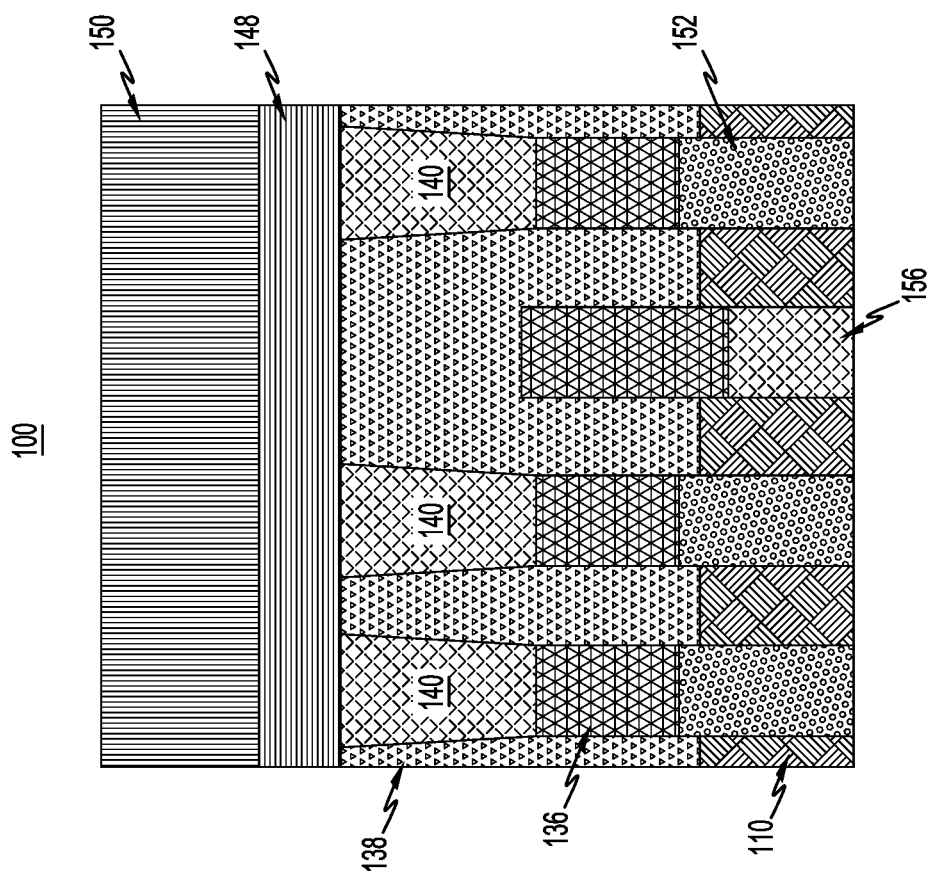

FIG. 19C depicts a side cross-sectional view of the semiconductor structure taken along the X-X axis of FIG. 2A for use at the nineteenth-intermediate fabrication stage, according to an illustrative embodiment.

Figure 20A:
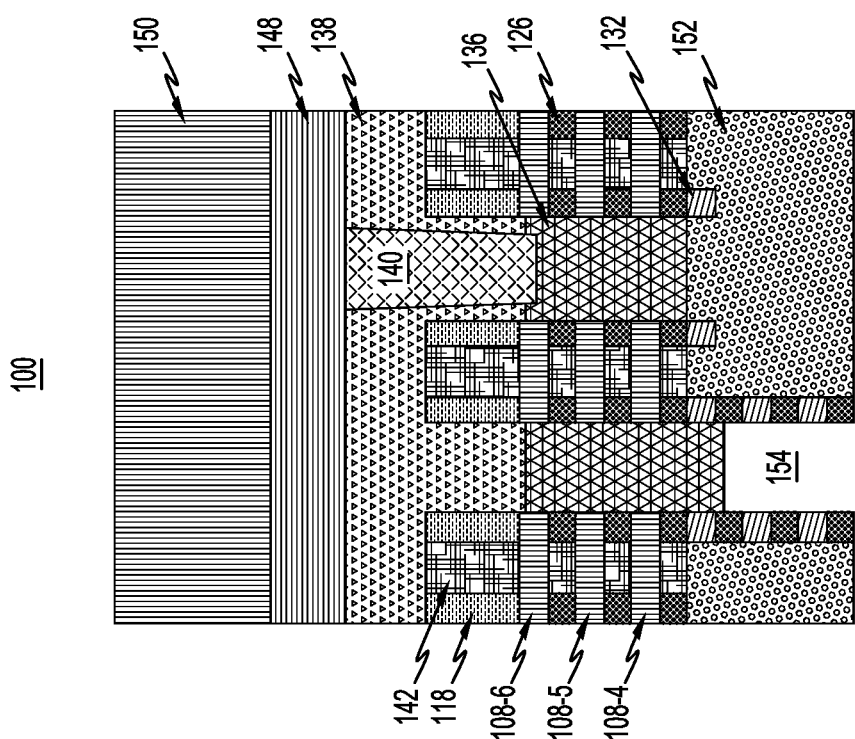

FIG. 20A depicts a side cross-sectional view of the semiconductor structure taken along the Y1-Y1 axis of FIG. 2A for use at a twentieth-intermediate fabrication stage, according to an illustrative embodiment.

Figure 20C:
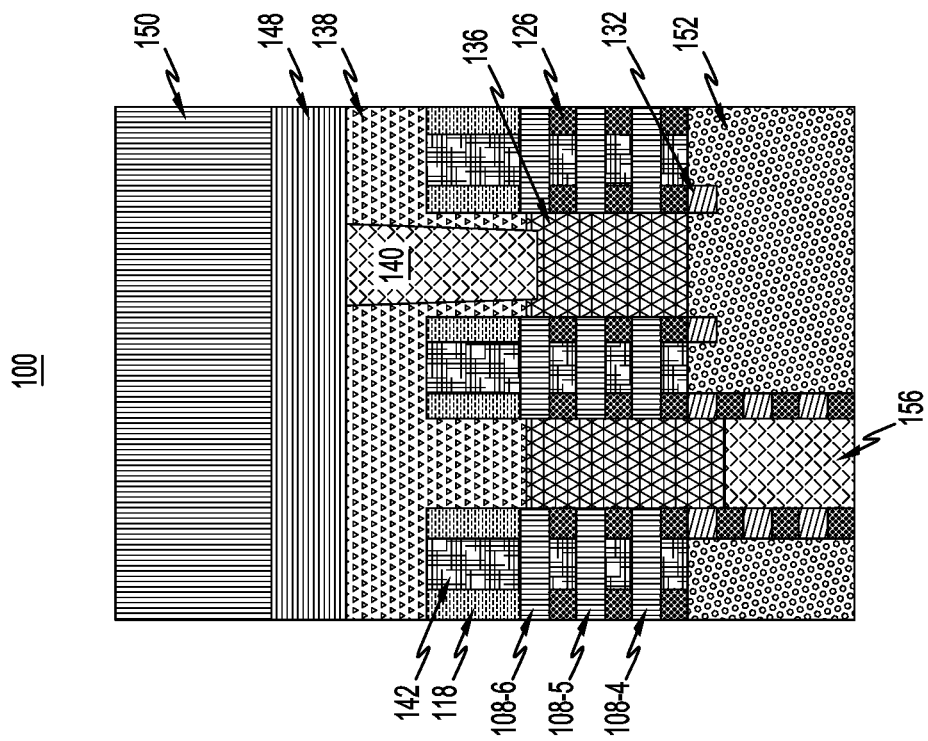
Figure 20B:
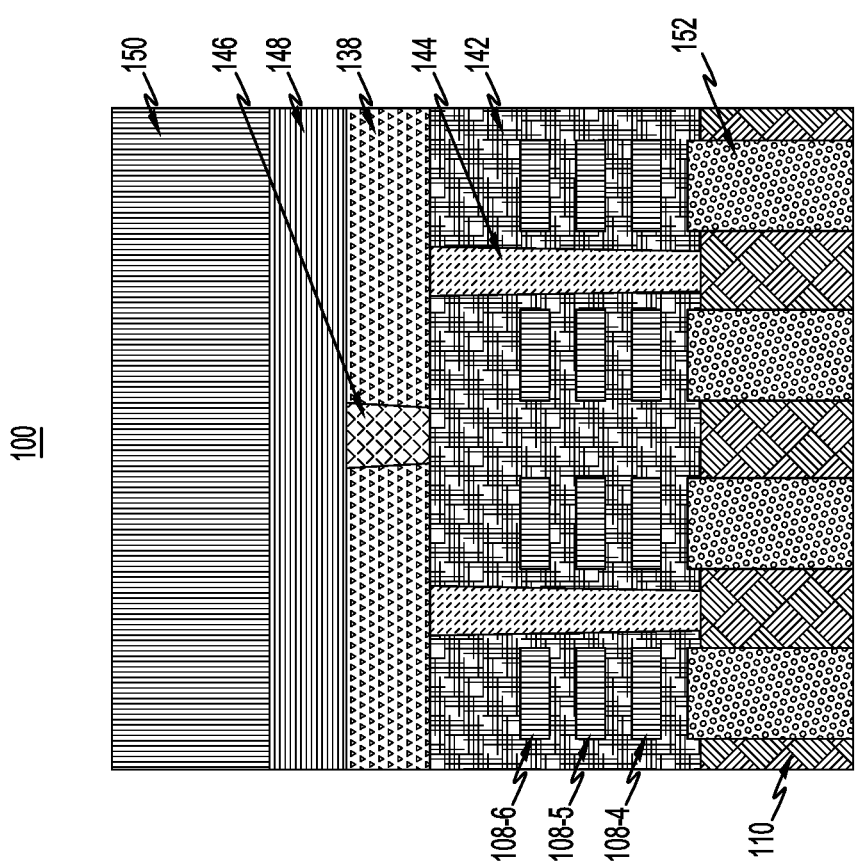

FIG. 20B depicts a side cross-sectional view of the semiconductor structure taken along the Y2-Y2 axis of FIG. 2A for use at the twentieth-intermediate fabrication stage, according to an illustrative embodiment.

FIG. 20C depicts a side cross-sectional view of the semiconductor structure taken along the X-X axis of FIG. 2A for use at the twentieth-intermediate fabrication stage, according to an illustrative embodiment.

Figure 21B:
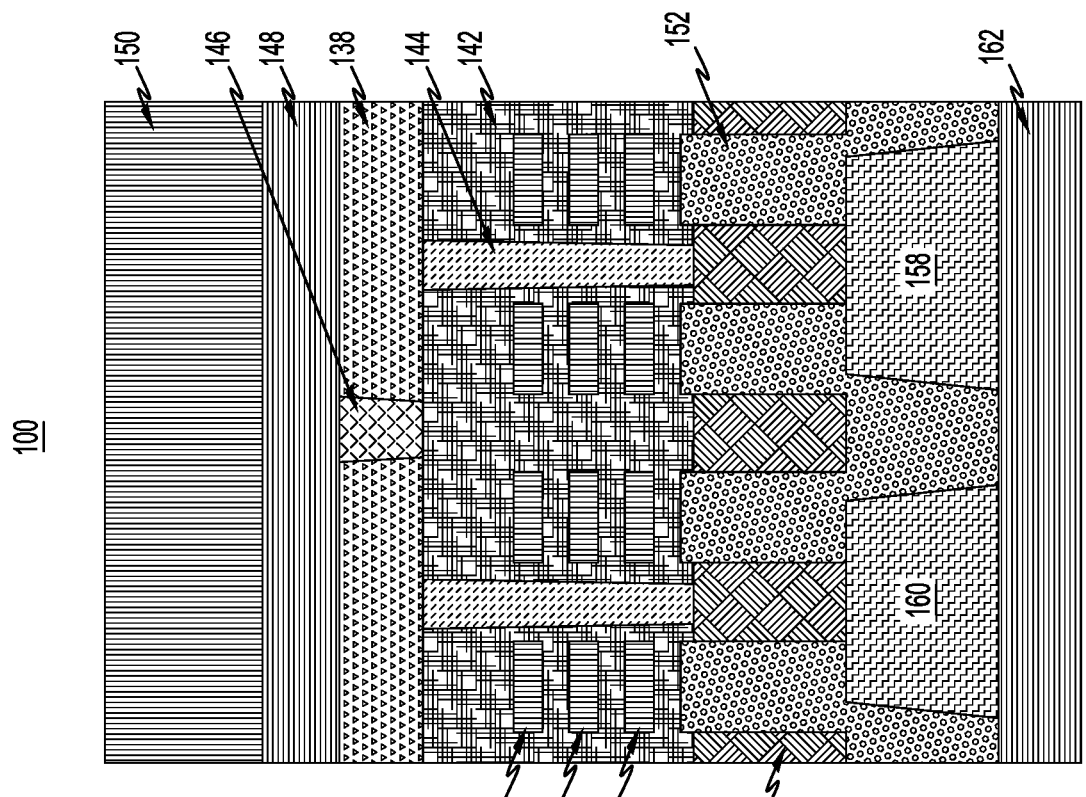
Figure 21A:
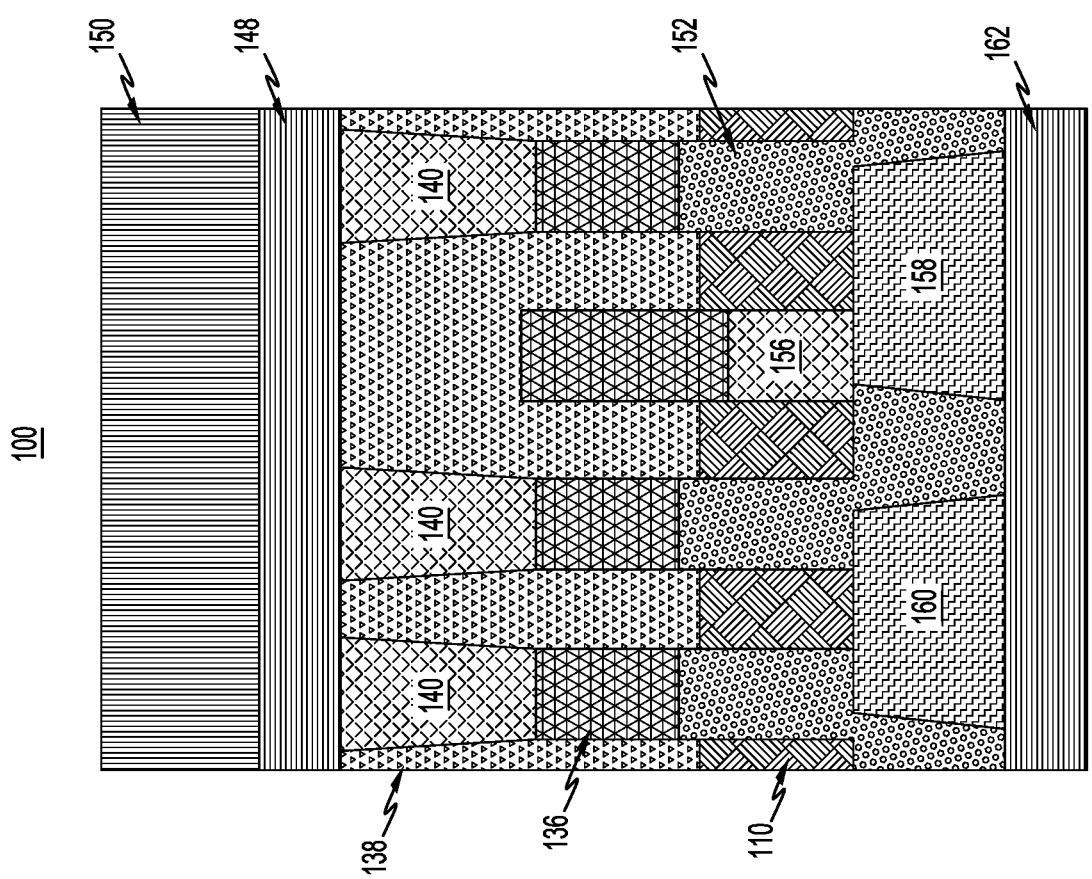

FIG. 21A depicts a side cross-sectional view of the semiconductor structure taken along the Y1-Y1 axis of FIG. 2A for use at a twenty first-intermediate fabrication stage, according to an illustrative embodiment.

FIG. 21B depicts a side cross-sectional view of the semiconductor structure taken along the Y2-Y2 axis of FIG. 2A for use at the twenty first-intermediate fabrication stage, according to an illustrative embodiment.

Figure 21C:
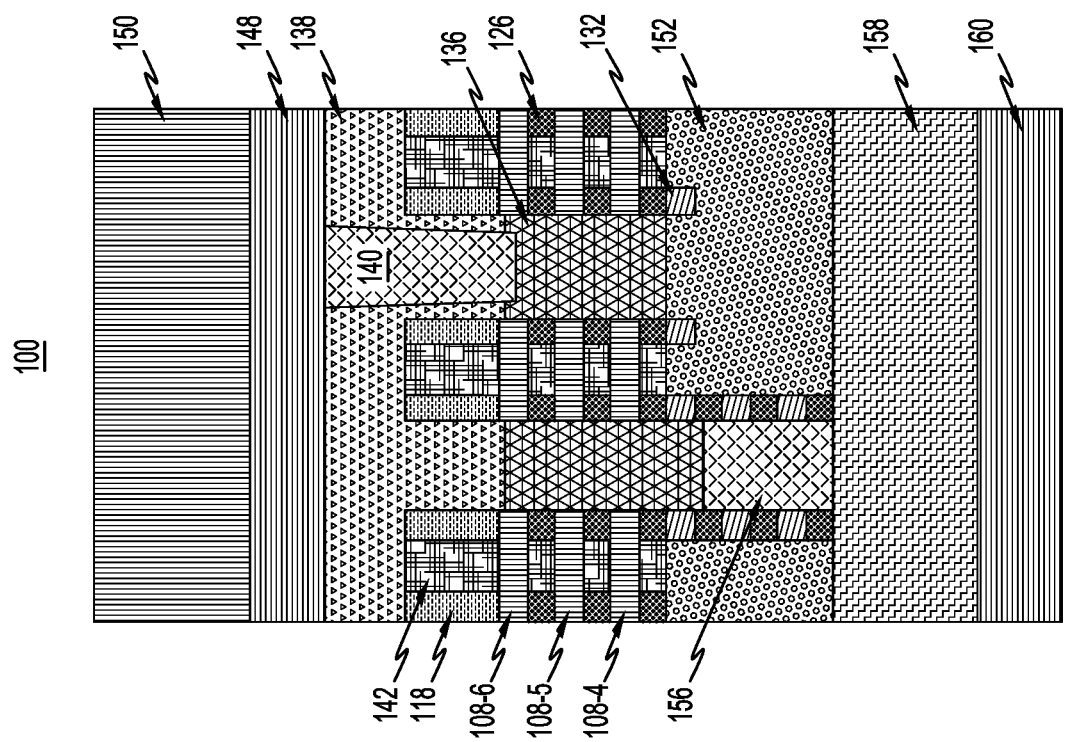

FIG. 21C depicts a side cross-sectional view of the semiconductor structure taken along the X-X axis of FIG. 2A for use at the twenty first-intermediate fabrication stage, according to an illustrative embodiment.

DETAILED DESCRIPTION

Illustrative embodiments of the invention may be described herein in the context of illustrative methods for forming a self-aligned backside contact in a nanosheet field effect transistor device without using a bottom dielectric insulator (BDI) layer, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Various techniques may be used to reduce the size of FETs. For example, nanosheet FETs help achieve a reduced FET device footprint while maintaining FET device performance. A nanosheet FET includes a plurality of nanosheets extending between a pair of source/drain regions. The device may be a gate all around transistor in which a gate surrounds at least a portion of the nanosheet channel. Present methods for forming nanosheet FETS do not use a bottom dielectric insulator (BDI) layer. However, the absence of a BDI layer may cause damage to the gate structure and/or the source/drain regions during substrate removal during the wafer backside processing stage.

Accordingly, illustrative embodiments described herein overcome the foregoing drawbacks. Referring now to FIGS. 1-21C, FIG. 1 shows a side cross-sectional view of a semiconductor structure 100, following formation of sacrificial layers 106-1 through 106-6 and nanosheet channel layers 108-1 through 108-6 over a substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer. The etch stop layer 104 may have a height (in direction Z-Z') in the range of 10 to 30 nanometers (nm).

Nanosheets are formed over the substrate 102, where the nanosheets include sacrificial layers 106-1 through 106-6 (collectively, sacrificial layers 106), and nanosheet channel layers 108-1 through 108-6 (collectively, nanosheet channel layers 108).

The sacrificial layers 106 are illustratively formed of sacrificial materials, such that they may be etched or otherwise removed selective to other layers on semiconductor structure 100. In some embodiments the sacrificial layers 106 are formed of SiGe, but with a designated percentage of Ge. For example, the sacrificial layers 106 may have a relatively higher percentage of Ge (e.g., 55% Ge), or may have a relatively lower percentage of Ge (e.g., 25% Ge). The sacrificial layers 106 may each have a thickness in the range of 6 to 15 nm.

The nanosheet channel layers 108 may be formed of Si or another suitable material (e.g., a material similar to that used for the substrate 102). Each of the nanosheet channel layers 108 may have a thickness in the range of 4 to 10 nm.

FIG. 2A shows a top-down view of a semiconductor structure 100. FIG. 2B shows a side cross-sectional view of the structure of FIG. 2A following the nanosheet patterning and the formation of the STI regions 110 and FET stacks 112A through 112D. Each of FET stacks 112A through 112D contain a FET device. However, this is merely illustrative and it is contemplated that FET stacks 112A through 112D can contain any number of FET devices. The first ones of the FET stacks 112A and 112B may comprise nFET devices and the second ones of FET stacks 112C and 112D may comprise pFET devices.

The STI regions 110 may be formed by patterning a masking layer over the semiconductor structure 100, followed by etching exposed portions of the nanosheet channel layers 108, the sacrificial layers 106, and through a portion of the substrate 102. The STI regions 110 may be formed of a dielectric material such as silicon dioxide ($SiO_2$), silicon oxycarbide (SiOC), silicon oxynitride (SiON), etc.

Figure 1:
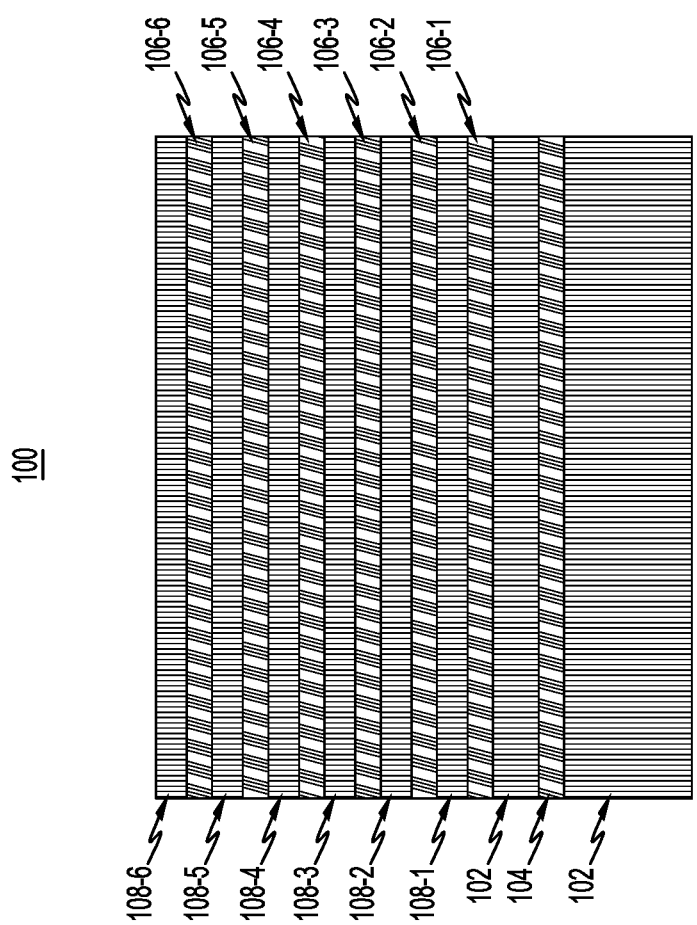
FIG. 1 depicts a side cross-sectional view of a semiconductor structure at a first-intermediate fabrication stage, according to an illustrative embodiment.
Figure 3B:
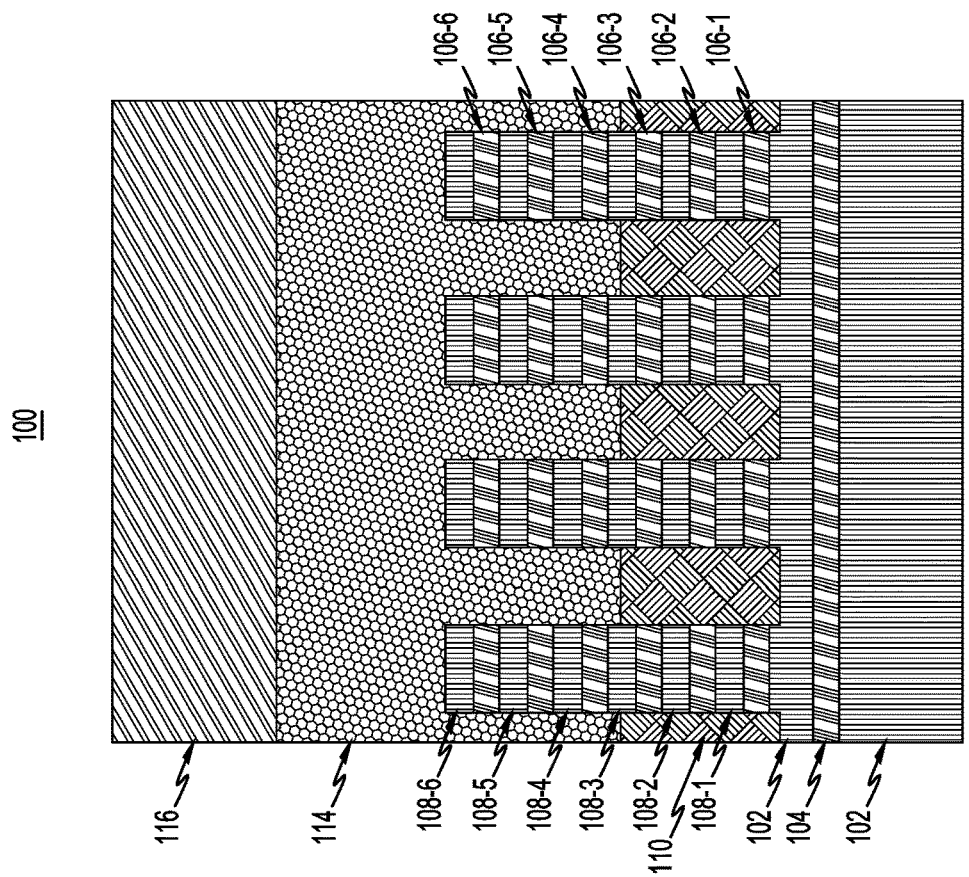
FIG. 3B depicts a side cross-sectional view of the semiconductor structure taken along the Y2-Y2 axis of FIG. 2A for use at the third-intermediate fabrication stage, according to an illustrative embodiment.
Figure 3A:
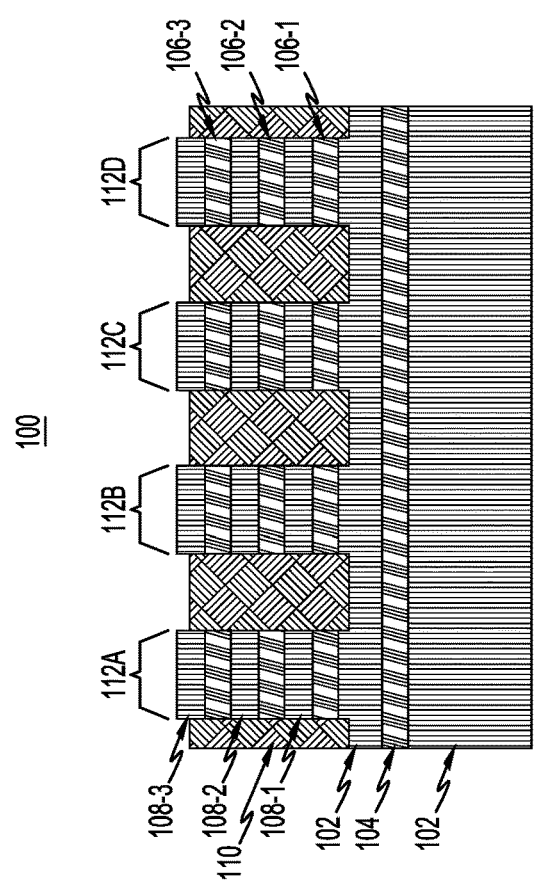
FIG. 3A depicts a side cross-sectional view of the semiconductor structure taken along the Y1-Y1 axis of FIG. 2A for use at a third-intermediate fabrication stage, according to an illustrative embodiment.
Figure 3C:
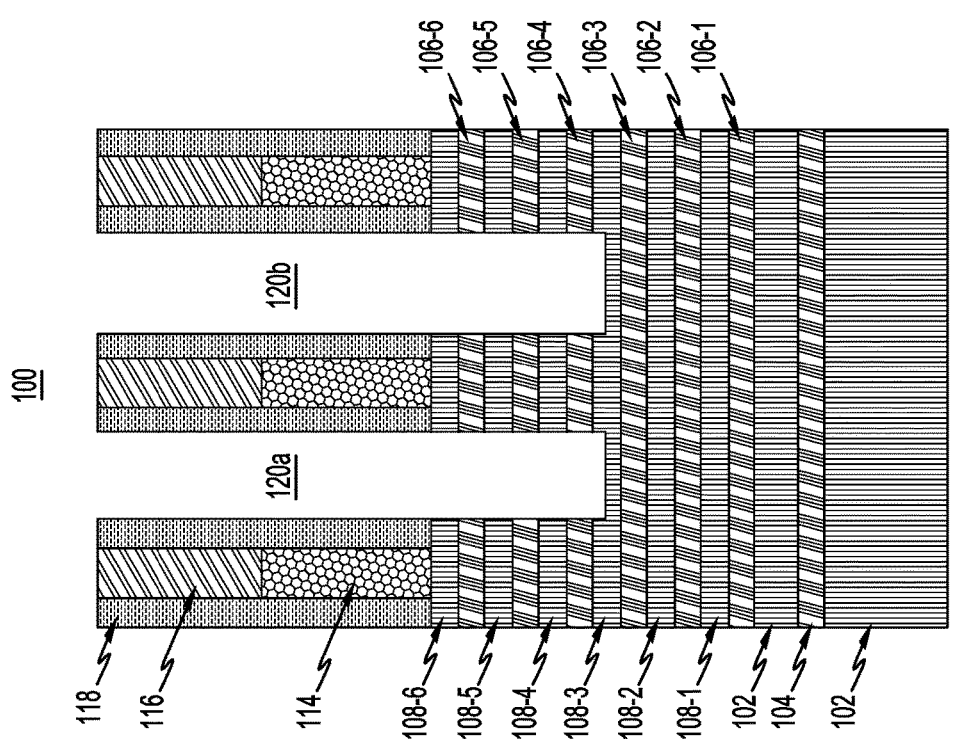
FIG. 3C depicts a side cross-sectional view of the semiconductor structure taken along the X-X axis of FIG. 2A for use at the third-intermediate fabrication stage, according to an illustrative embodiment.

FIGS. 3A-3C show semiconductor structure 100 at a third-intermediate fabrication stage. During this stage, dummy gate 114 and hardmask layer 116 are formed on the top most nanosheet channel layer 108 of FET stacks 112A through 112D. Suitable dummy gate material includes, for example, polycrystalline silicon, amorphous silicon or microcrystal silicon. Hardmask layer 116 can be composed of a flowable organic material such as, for example, a spin-on-carbon (SOC), $Si_3N_4$, SiBCN, SiNC, SiN, SiCO, $SiO_2$, and SiNOC. The dummy gate 114 can be formed by conventional lithographic and etching processes.

FIG. 3C show semiconductor structure 100 having sidewall spacers 118 formed on dummy gate 114 and hardmask layer 116. Suitable material for sidewall spacers 118 includes a nitride or an oxynitride such as, for example, $Si_3N_4$, SiBCN, SiNC, SiN, SiCO, $SiO_2$ and SiNOC. In some exemplary embodiments, sidewall spacers 118 can include a material that is resistant to some etching processes such as, for example, HF chemical etching or chemical oxide removal etching. The sidewall spacers 118 can be formed using conventional deposition techniques such as by physical vapor deposition (PVD), atomic layer deposition (ALD), chemical vapor deposition (CVD), etc. FIG. 3C further shows openings 120a and 120b formed when recessing sacrificial layers 106 and nanosheet channel layers 108.

Figure 4A:
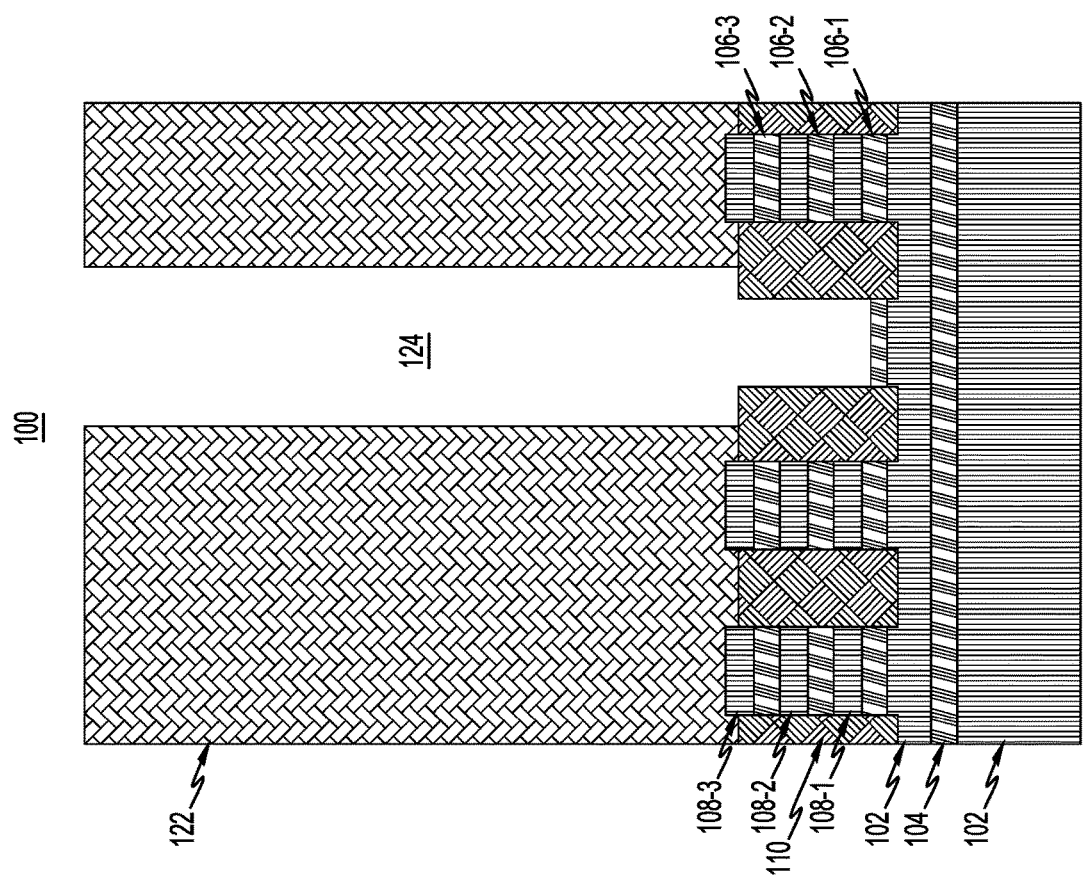
FIG. 4A depicts a side cross-sectional view of the semiconductor structure taken along the Y1-Y1 axis of FIG. 2A for use at a fourth-intermediate fabrication stage, according to an illustrative embodiment.

FIGS. 4A-4C show semiconductor structure 100 at a fourth-intermediate fabrication stage. During this stage, mask layer 122 (such as an organic planarization layer (OPL) or a spin-on-carbon (SOC)) is deposited on semiconductor structure 100 using any conventional deposition process such spin-on coating or any other suitable deposition process. Next, the mask layer 122 is patterned and then selectively etched to form backside contact openings 120a' and 124. In illustrative embodiments, backside contact openings 120a' is formed by extending opening 120a (see FIG. 3C) through a portion of the bottom most sacrificial layer 106.

Figure 5B:
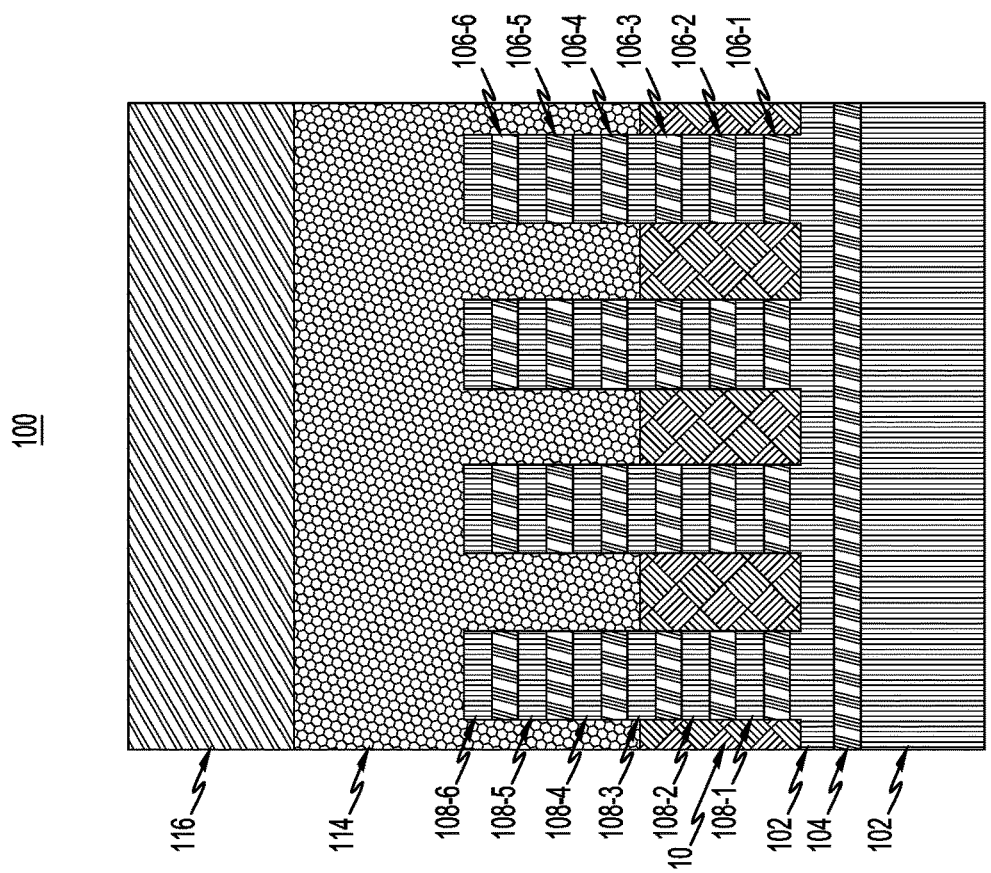
FIG. 5B depicts a side cross-sectional view of the semiconductor structure taken along the Y2-Y2 axis of FIG. 2A for use at the fifth-intermediate fabrication stage, according to an illustrative embodiment.
Figure 5A:
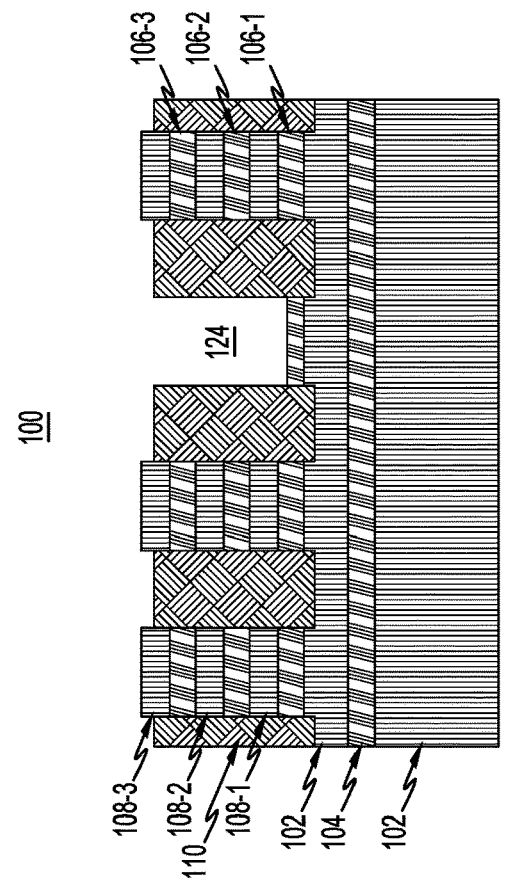
FIG. 5A depicts a side cross-sectional view of the semiconductor structure taken along the Y1-Y1 axis of FIG. 2A for use at a fifth-intermediate fabrication stage, according to an illustrative embodiment.

FIGS. 5A-5C show semiconductor structure 100 at a fifth-intermediate fabrication stage. During this stage, mask layer 122 is removed, for example, by an ash etching process, leaving backside contact openings 120a' and 124 and reforming opening 120b (see FIG. 3C). Inner spacers 126 are formed to fill desired indent spaces (e.g., resulting from indent etches of the sacrificial layers 106 prior to their removal). The inner spacers 126 may be formed of silicon nitride (SiN) or another suitable material such as SiBCN, silicon carbide oxide (SiCO), SiOCN, etc.

Figure 6C:
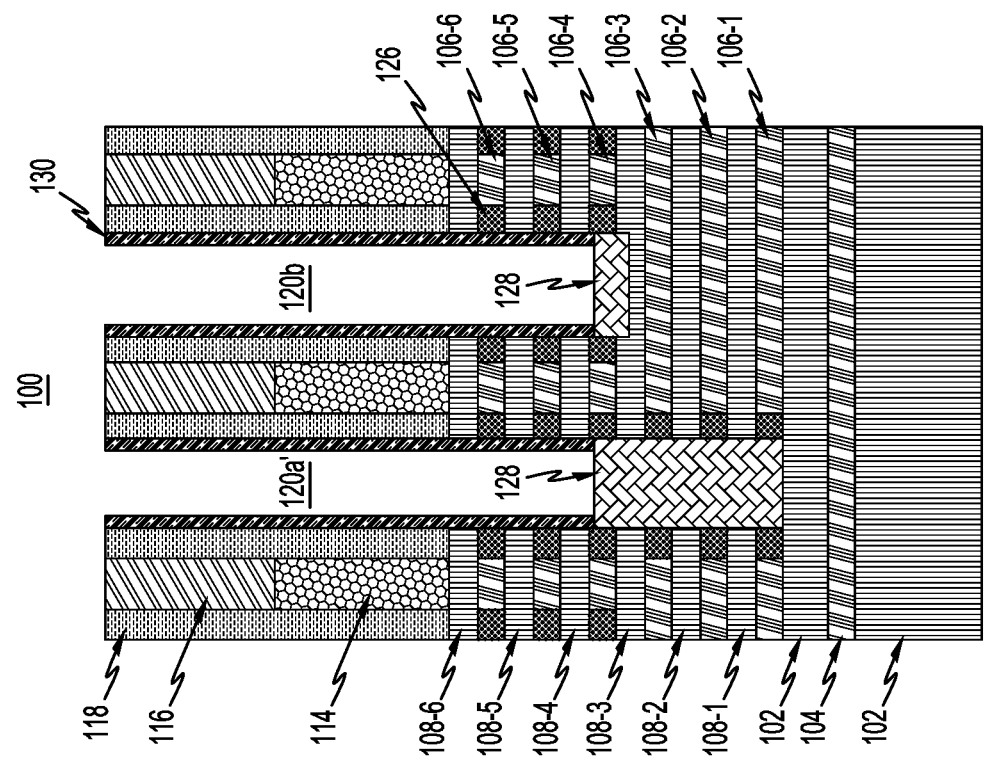
FIG. 6C depicts a side cross-sectional view of the semiconductor structure taken along the X-X axis of FIG. 2A for use at the sixth-intermediate fabrication stage, according to an illustrative embodiment.
Figure 6B:
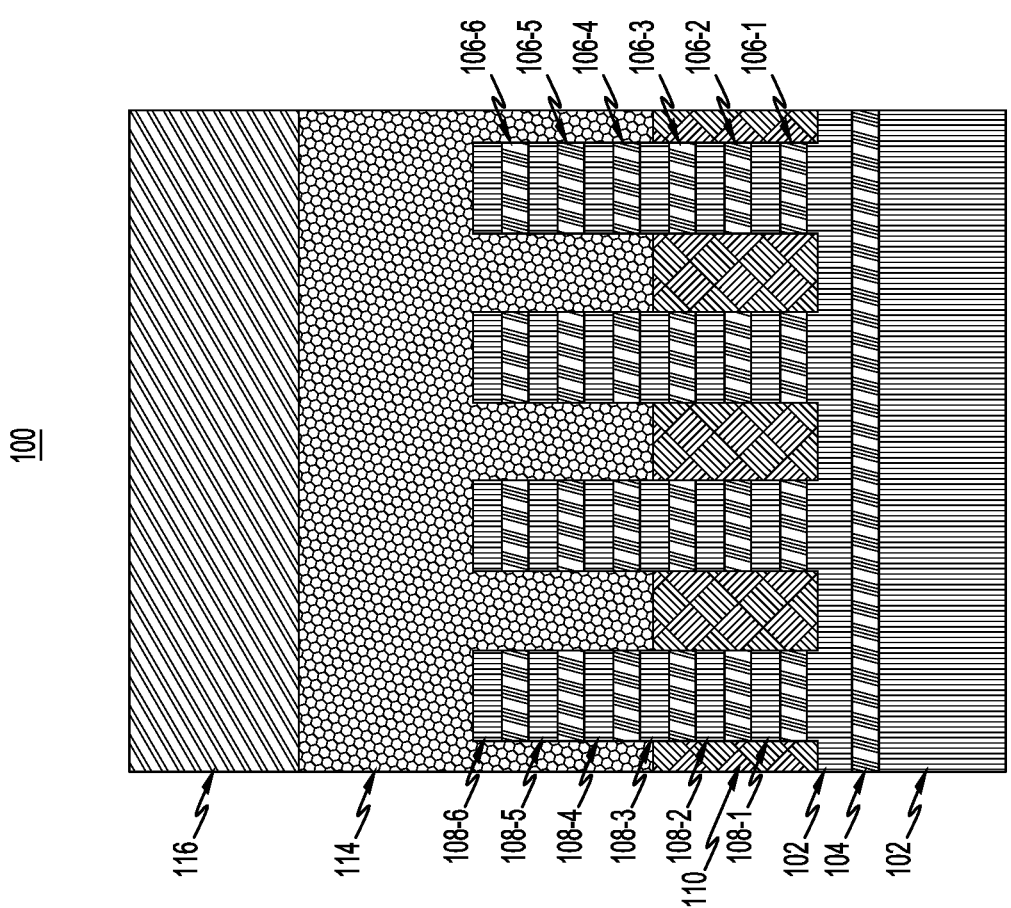
FIG. 6B depicts a side cross-sectional view of the semiconductor structure taken along the Y2-Y2 axis of FIG. 2A for use at the sixth-intermediate fabrication stage, according to an illustrative embodiment.

FIGS. 6A-6C show semiconductor structure 100 at a sixth-intermediate fabrication stage. During this stage, mask layer 128 is formed in backside contact opening 124 and over semiconductor structure 100. Mask layer 128 is also formed in backside contact opening 120a' and opening 120b and below a top surface of the nanosheet channel layers 108. Mask layer 128 can be formed in a similar manner and of similar material as mask layer 122. In illustrative embodiments, mask layer 128 covers a top surface of the top most nanosheet channel layer 108-3.

Sidewall spacers 130 are formed on sidewalls of the openings above mask layer 128. Sidewall spacers 130 can be formed in a similar manner but with different material compared with sidewall spacers 118.

Figure 7B:
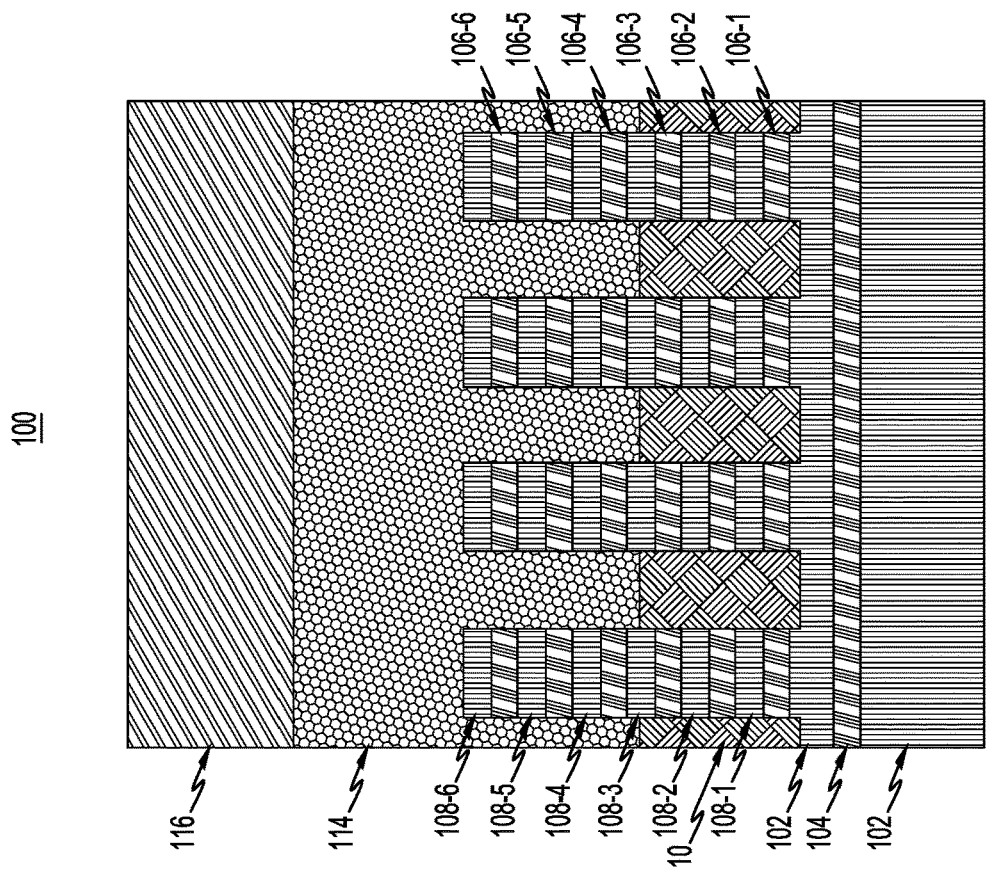
FIG. 7B depicts a side cross-sectional view of the semiconductor structure taken along the Y2-Y2 axis of FIG. 2A for use at the seventh-intermediate fabrication stage, according to an illustrative embodiment.
Figure 7A:
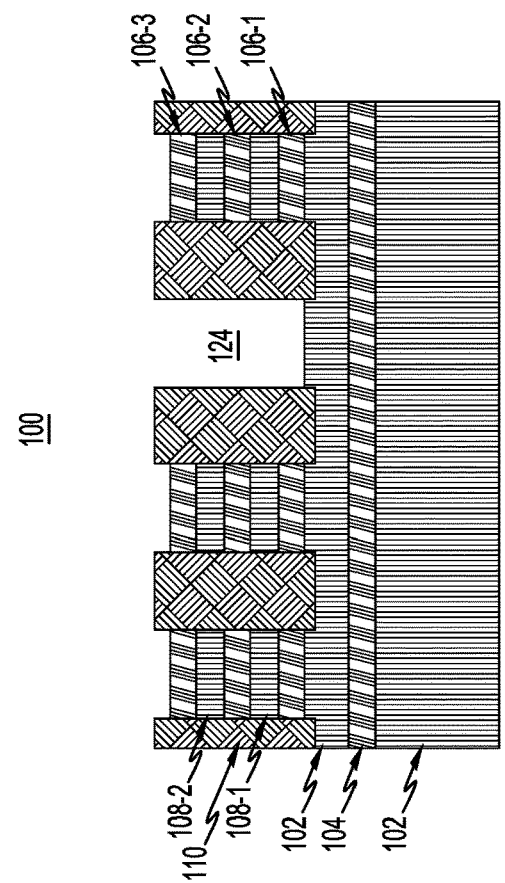
FIG. 7A depicts a side cross-sectional view of the semiconductor structure taken along the Y1-Y1 axis of FIG. 2A for use at a seventh-intermediate fabrication stage, according to an illustrative embodiment.
Figure 7C:
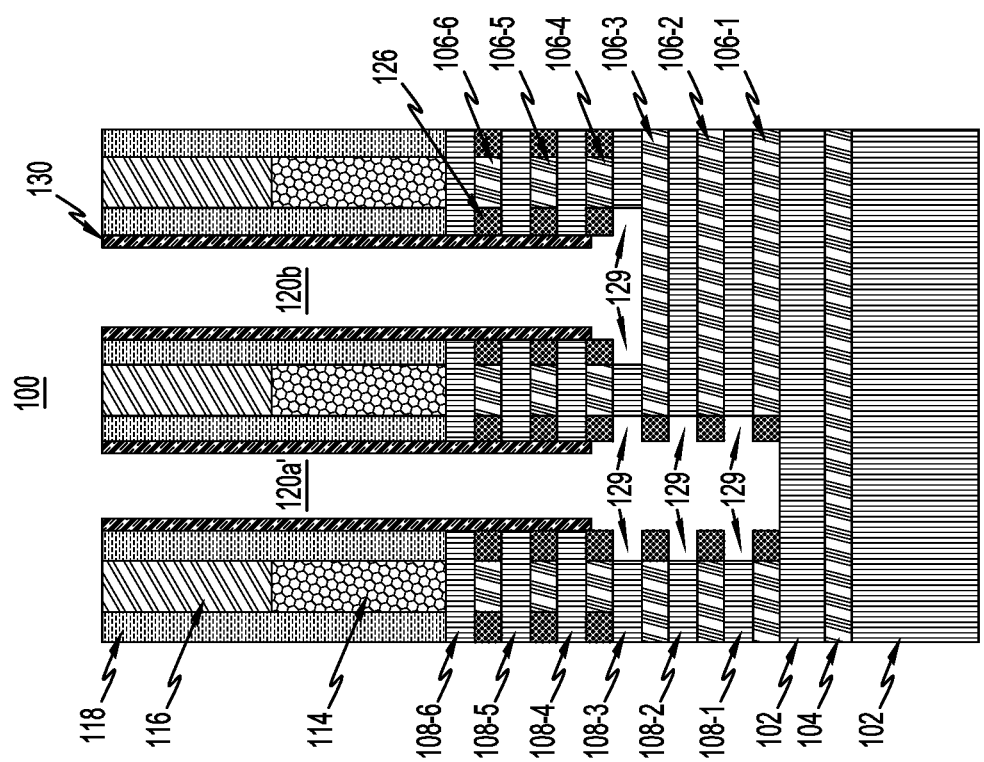
FIG. 7C depicts a side cross-sectional view of the semiconductor structure taken along the X-X axis of FIG. 2A for use at the seventh-intermediate fabrication stage, according to an illustrative embodiment.

FIGS. 7A-7C show semiconductor structure 100 at a seventh-intermediate fabrication stage. During this stage, mask layer 128 is removed from semiconductor structure 100 by, for example, an ash etching process. Next, indent spaces 129 are formed by a selective indentation process. FIG. 7A shows backside contact opening 124 following removal of mask layer 128. FIG. 7C shows a portion of exposed nanosheet channel layers 108-1, 108-2 and 108-3 removed in the backside contact opening 120a' and opening 120b following removal of mask layer 128 to create indent spaces between inner spacers 126. The indent spaces 129 can be created by an etching process of nanosheet channel layers 108 selective to sacrificial layers 106, such as wet etch.

Figure 8A:
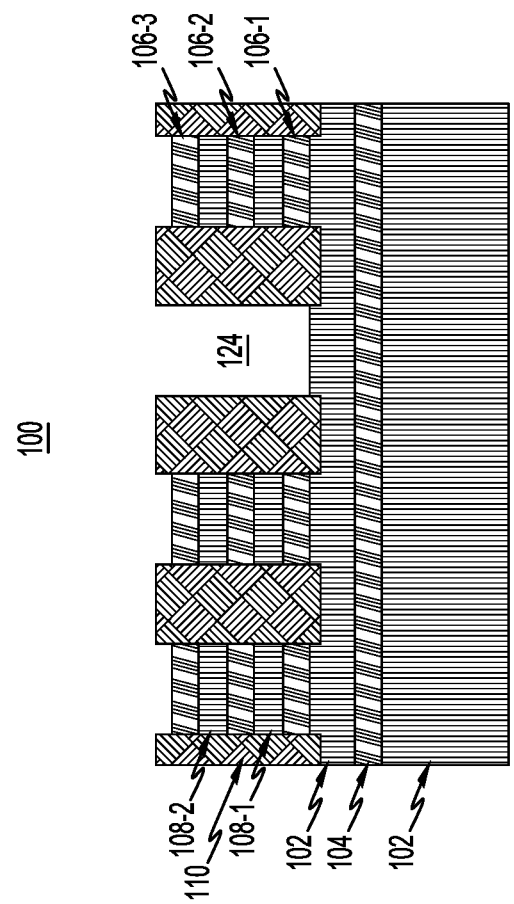
FIG. 8A depicts a side cross-sectional view of the semiconductor structure taken along the Y1-Y1 axis of FIG. 2A for use at an eighth-intermediate fabrication stage, according to an illustrative embodiment.

FIGS. 8A-8C show semiconductor structure 100 at an eighth-intermediate fabrication stage. During this stage, sidewall spacers 130 are removed using a standard dry or wet etch process. Next, inner spacers 132 are formed in the indent spaces 129 resulting from indent etches of the nanosheet channel layers 108-1, 108-2 and 108-3 in the backside contact opening 120a' and opening 120b. The inner spacers 132 can be formed in a similar manner and of a similar material as inner spacers 126. In non-limiting illustrative embodiments, inner spacers 126 and inner spacers 132 are in an alternating pattern and are of different material. In non-limiting illustrative embodiments, inner spacers 126 and inner spacers 132 are in an alternating pattern and include multiple segments in a vertical position.

Figure 9B:
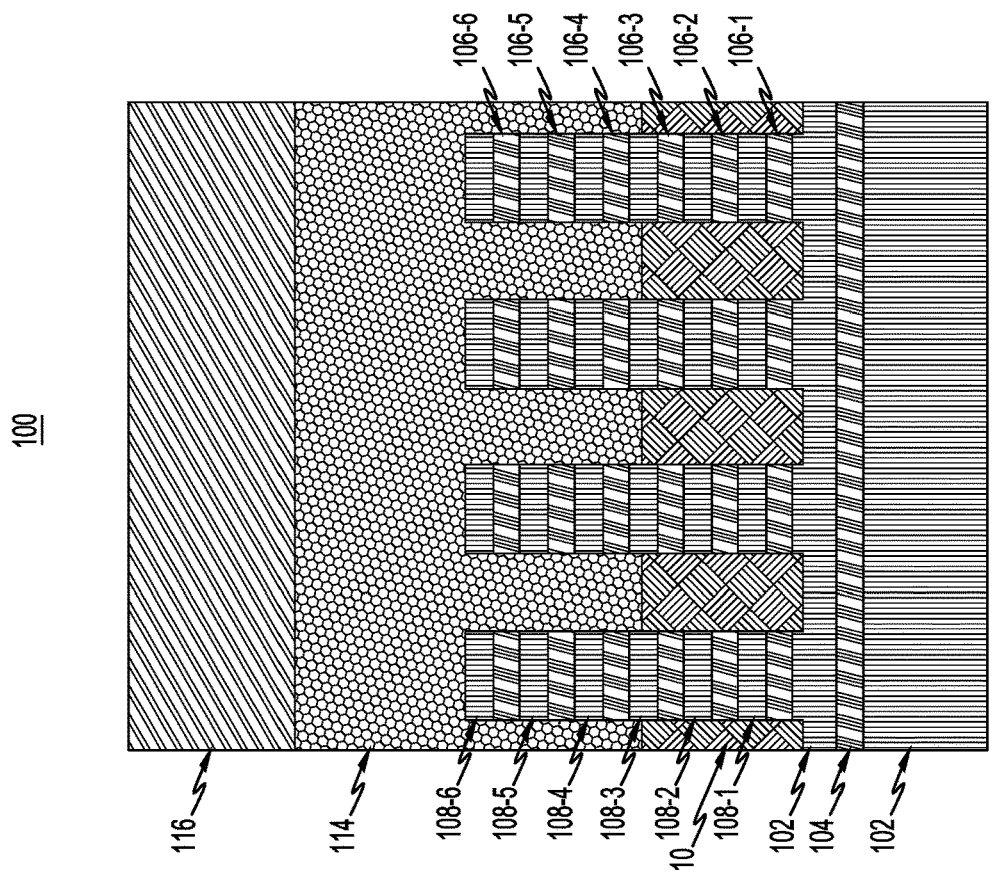
FIG. 9B depicts a side cross-sectional view of the semiconductor structure taken along the Y2-Y2 axis of FIG. 2A for use at the ninth-intermediate fabrication stage, according to an illustrative embodiment.
Figure 9A:
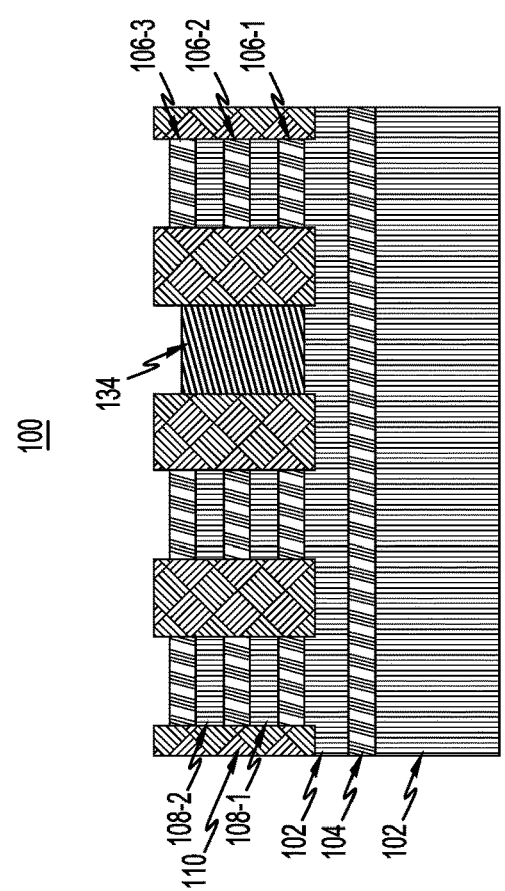
FIG. 9A depicts a side cross-sectional view of the semiconductor structure taken along the Y1-Y1 axis of FIG. 2A for use at a ninth-intermediate fabrication stage, according to an illustrative embodiment.

FIGS. 9A-9C show semiconductor structure 100 at a ninth-intermediate fabrication stage. During this stage, a sacrificial placeholder layer 134 is formed in backside contact opening 124 and below a top surface of STI regions 110 as illustrated in FIG. 9A. Sacrificial placeholder layer 134 is also formed in backside contact opening 120a' and below a top surface of the top most inner spacers 132 as illustrated in FIG. 9C. Sacrificial placeholder layer 134 can be formed using any conventional deposition process such as PVD, ALD and CVD, or bottom-up epitaxial growth process. Sacrificial placeholder layer 134 may be formed of a sacrificial material or materials, such as titanium oxide ($TiO_x$), aluminum oxide ($AlO_x$), silicon carbide (SiC), SiGe, III-V materials, etc.

Figure 10C:
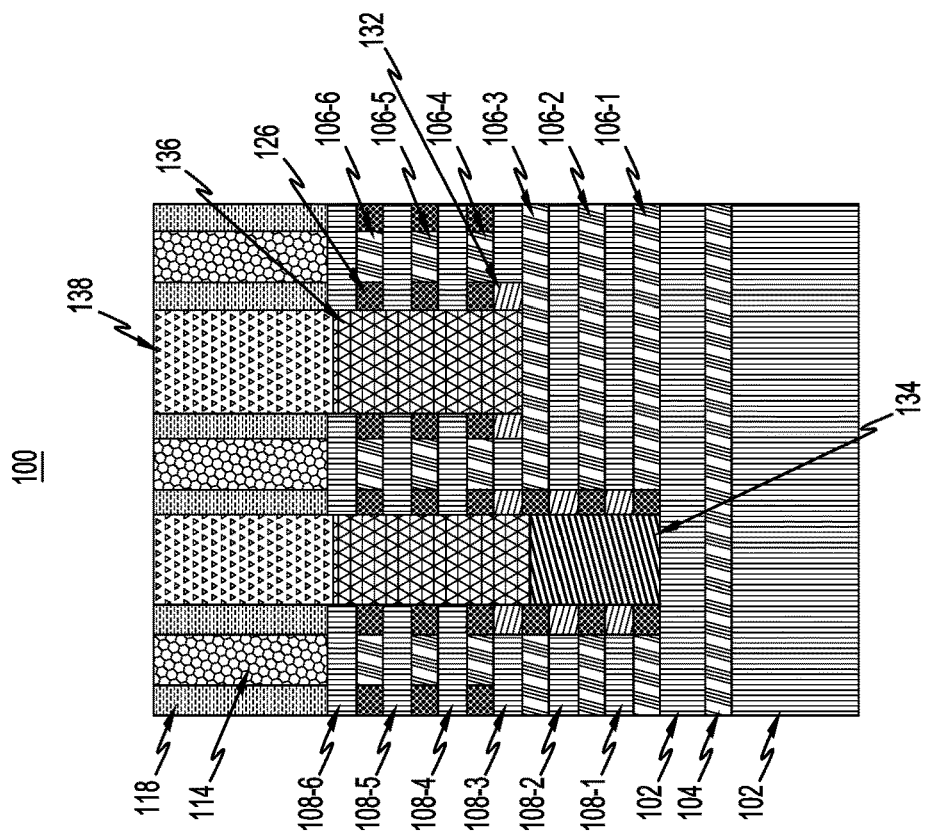
FIG. 10C depicts a side cross-sectional view of the semiconductor structure taken along the X-X axis of FIG. 2A for use at the tenth-intermediate fabrication stage, according to an illustrative embodiment.
Figure 10B:
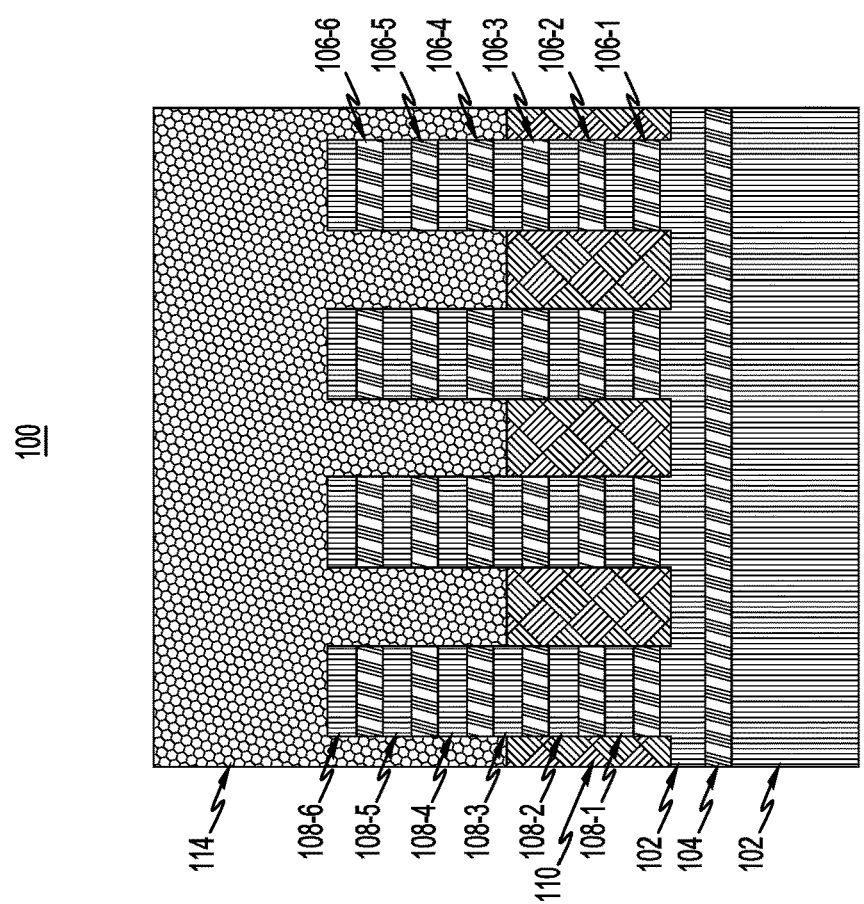
FIG. 10B depicts a side cross-sectional view of the semiconductor structure taken along the Y2-Y2 axis of FIG. 2A for use at the tenth-intermediate fabrication stage, according to an illustrative embodiment.

FIGS. 10A-10C show semiconductor structure 100 at a tenth-intermediate fabrication stage. During this stage, source/drain regions 136 are formed on sacrificial placeholder layer 134 and on the top most sacrificial layer 106-3 using, for example, epitaxial growth processes. Source/drain regions 136 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy). Epitaxial materials may be grown from gaseous or liquid precursors.

Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain regions can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

Next, interlayer dielectric (ILD) layer 138 is formed on source/drain regions 136 using any conventional deposition process such as ALD, PVD, or CVD, followed by a planarization process such as CMP. ILD layer 138 can be formed of any suitable dielectric material, such as $SiO_2$, SiOC, SiON, etc.

FIGS. 11A-11C show semiconductor structure 100 at an eleventh-intermediate fabrication stage. During this stage, dielectric pillars 144 may be formed in dummy gates 114 and sidewall spacers 118. For example, in illustrative embodiments, a gate cut is performed in semiconductor structure 100 by conventional techniques to form an opening which stops on the STI regions 110. A dielectric fill is then deposited in the opening and fills the opening to form dielectric pillars 144. The dielectric pillars 144 may be formed by filling a dielectric material such as, for example, SiN, $SiO_2$, SiOC, SiOCN, SiBCN, SiC, etc. in the opening, followed by planarization using CMP or any other suitable planarization process.

After that, the dummy gates 114 and sacrificial layers 106-4, 106-5 and 106-6 are removed, followed by formation of the gate stack layer 142 (e.g., using replacement HKMG processing). The gate stack layer 142 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

An additional amount of ILD layer 138 can be deposited on gate stack layer 142 and dielectric pillars 144, followed by a planarization process such as CMP. Next, the middle-of-the-line contacts 140 are formed over source/drain regions 136 disposed over the top most sacrificial layer 106-3 by standard patterning and lithographic processing. For example, in illustrative embodiments, an additional amount of ILD layer 138 can be deposited on semiconductor structure 100, followed by a planarization process such as CMP. Next, ILD layer 138 is subjected to a conventional lithographic and etching process to form middle-of-the-line contact openings. The middle-of-the-line contact openings are formed to expose the source/drain regions 136 that are not formed on sacrificial placeholder layer 134. A contact metal is then deposited in the resulting middle-of-the-line contact openings to form middle-of-the-line contacts 140 using any conventional technique such as ALD, CVD, PVD, and/or plating. Suitable contact metals include, a silicide liner such as Ti, Ni, or NiPt, etc, a thin adhesion metal liner, such as TiN, and high conductive metal fills, such as, for example, tungsten (W), aluminum (Al), copper (Cu), cobalt (Co), ruthenium (Ru), molybdenum (Mo), or any other suitable conductive material. The contact metals can be planarized using, for example, a planarizing process such as CMP. Other planarization processes can include grinding and polishing. A middle-of-the-line contact 146 is also formed in ILD layer 138 and on gate stack layer 142. Middle-of-the-line contact 146 can be formed using a similar process and of similar materials as middle-of-the-line contacts 140.

Frontside back-end-of-line (BEOL) interconnect 148 formation, followed by bonding of the structure to a carrier wafer 150 is then carried out. The frontside BEOL interconnect 148 includes various BEOL interconnect structures. For example, frontside BEOL interconnect 148 is a metallization structure that includes one or more metal layers disposed on a side of semiconductor structure 100 opposite of the side on which the backside BEOL metallization structure is disposed. The metal layers of the frontside BEOL interconnect 148 each have metal lines for making interconnections to the semiconductor device.

Carrier wafer 150 may be formed of materials similar to that of the substrate 102, and may be formed over the frontside BEOL interconnect 148 using a wafer bonding process, such as dielectric-to-dielectric bonding.

FIGS. 12A-12C show semiconductor structure 100 at a twelfth-intermediate fabrication stage. During this stage, backside processing of the substrate 102 is carried out. This can be accomplished, for example, by flipping the structure over so that the backside of the substrate 102 (i.e., the back surface) is facing up. First, portions of the substrate 102 may be removed from the backside using, for example, a combination of wafer grinding, CMP, dry etch and/or wet etch to selectively remove substrate 102 until the etch stop layer 104 is reached.

FIGS. 13A-13C show semiconductor structure 100 at a thirteenth-intermediate fabrication stage. During this stage, the etch stop layer 104 is selectively removed using, for example, a wet etch to selectively remove etch stop layer 104 until substrate 102 is reached.

FIGS. 14A-14C show semiconductor structure 100 at a fourteenth-intermediate fabrication stage. During this stage, the remaining portions of the substrate 102 are removed utilizing a selective etch process such as a wet etch.

FIGS. 15A-15C show semiconductor structure 100 at a fifteenth-intermediate fabrication stage. During this stage, the bottom most sacrificial layer 106-1 is removed utilizing a selective etch process such as a wet etch to expose the bottom most nanosheet channel layer 108-1.

FIGS. 16A-16C show semiconductor structure 100 at a sixteenth-intermediate fabrication stage. During this stage, a sequential selective etching of nanosheet channel layers 108-1 and 108-2 and sacrificial layers 106-2 and 106-3 is carried to prevent any damage to the bottom of gate stack layer 142 utilizing a selective etch process such as a wet etch.

FIGS. 17A-17C show semiconductor structure 100 at a seventeenth-intermediate fabrication stage. During this stage, an optional selective etching of nanosheet channel layer 108-4 selective to gate stack layer 142 is carried out using, for example, an atomic layer etching process.

FIGS. 18A-18C show semiconductor structure 100 at an eighteenth-intermediate fabrication stage. During this stage, backside ILD layer 152 may be formed of similar processes and material as ILD layer 138. The material of the backside ILD layer 152 may initially be overfilled, followed by planarization (e.g., using CMP).

FIGS. 19A-19C show semiconductor structure 100 at a nineteenth-intermediate fabrication stage. During this stage, sacrificial placeholder layer 134 is selectively removed to form an opening 154 using any suitable etch processing that removes the material of the sacrificial placeholder layer 134 selective to that of the rest of the structure. A suitable etching process includes, for example, wet etch.

FIGS. 20A-20C show semiconductor structure 100 at a twentieth-intermediate fabrication stage. During this stage, backside source/drain contacts 156 are formed by depositing a suitable contact metal in the openings 154. A suitable contact metal can be any of the contact metals discussed above for middle-of-the-line contacts 140.

FIGS. 21A-21C show semiconductor structure 100 at a twenty first-intermediate fabrication stage. During this stage, power (Vdd) rails 158 to provide supply voltage to the structure and ground (GND or Vss) rails 160 to provide a series of power supplies are formed. The conductive metal may include, but is not limited to, tungsten, copper, aluminum, silver, gold and alloys thereof.

Next, backside BEOL interconnect 162 is formed on backside ILD layer 152, power (Vdd) rails 158 and ground (GND or Vss) rails 160 using similar processes and similar structures as frontside BEOL interconnect 148.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a source/drain region having a backside surface disposed in a backside interlayer dielectric layer;
a backside contact disposed in the backside interlayer dielectric layer, wherein the backside contact is disposed on the backside surface of the source/drain region;
backside sidewall spacers disposed between sidewalls of the backside interlayer dielectric layer and sidewalls of the backside contact and the backside surface of the source drain region; and
a backside power rail connected to the source/drain region through the backside contact;
wherein the backside sidewall spacers comprise multiple segments of a first sidewall spacer and a second sidewall spacer in an alternating pattern.

2. The semiconductor structure of claim 1, further comprising a first field-effect transistor disposed on the backside interlayer dielectric layer and a second field-effect transistor disposed on the backside interlayer dielectric layer and adjacent the first field-effect transistor.

3. The semiconductor structure of claim 2, wherein the first field-effect transistor comprises a first gate structure, and the second field-effect transistor comprises a second gate structure.

4. The semiconductor structure of claim 3, where the backside interlayer dielectric layer is in contact with the first gate structure and the second gate structure.

5. The semiconductor structure of claim 3, where a portion of the source/drain region extends above the backside interlayer dielectric layer and is located between the first field-effect transistor and the second field-effect transistor.

6. The semiconductor structure of claim 5, wherein the first field-effect transistor and the second field-effect transistor comprise respective nanosheet field-effect transistor devices.

7. The semiconductor structure of claim 1, further comprising a first nanosheet field-effect transistor disposed on the backside interlayer dielectric layer and a second nanosheet field-effect transistor disposed on the backside interlayer dielectric layer and adjacent the first nanosheet field-effect transistor;
wherein the first nanosheet field-effect transistor and the second nanosheet field-effect transistor comprise inner spacers that are composed of a segment of one of the first sidewall spacer and the second sidewall spacer.

8. A semiconductor structure, comprising:
a first source/drain region having a backside surface disposed in a backside interlayer dielectric layer;
a second source/drain region disposed on the backside interlayer dielectric layer and located adjacent the first source/drain region;
a backside contact disposed in the backside interlayer dielectric layer and in contact with the backside surface of the first source/drain region; and
backside sidewall spacers disposed between sidewalls of the backside interlayer dielectric layer and sidewalls of the backside contact and the backside surface of the first source/drain region;
wherein the backside sidewall spacers comprise multiple segments of a first sidewall spacer and a second sidewall spacer in an alternating pattern.

9. The semiconductor structure of claim 8, further comprising a backside power rail connected to the first source/drain region through the backside contact.

10. The semiconductor structure of claim 8, further comprising a first field-effect transistor disposed on the backside interlayer dielectric layer and a second field-effect transistor disposed on the backside interlayer dielectric layer and adjacent the first field-effect transistor.

11. The semiconductor structure of claim 10, wherein the first field-effect transistor comprises a first gate structure, and the second field-effect transistor comprises a second gate structure.

12. The semiconductor structure of claim 11, where the backside interlayer dielectric layer is in contact with the first gate structure and the second gate structure.

13. The semiconductor structure of claim 12, where a portion of the first source/drain region extends above the backside interlayer dielectric layer and is located between the first field-effect transistor and the second field-effect transistor.

14. The semiconductor structure of claim 13, wherein the first field-effect transistor and the second field-effect transistor comprise respective nanosheet field-effect transistor devices.

15. An integrated circuit, comprising:
one or more semiconductor structures, wherein at least one of the one or more semiconductor structures comprises:
a source/drain region having a backside surface disposed in a backside interlayer dielectric layer;
a backside contact disposed in the backside interlayer dielectric layer, wherein the backside contact is disposed on the backside surface of the source/drain region;
backside sidewall spacers disposed between sidewalls of the backside interlayer dielectric layer and sidewalls of the backside contact and the backside surface of the source drain region; and
a backside power rail connected to the source/drain region through the backside contact;
wherein the backside sidewall spacers comprise multiple segments of a first sidewall spacer and a second sidewall spacer in an alternating pattern.

16. The integrated circuit of claim 15, wherein the at least one of the one or more semiconductor structures further comprises a first nanosheet field-effect transistor disposed on the backside interlayer dielectric layer and a second nanosheet field-effect transistor disposed on the backside interlayer dielectric layer and adjacent the first nanosheet field-effect transistor.

17. The integrated circuit of claim 16, wherein the first nanosheet field-effect transistor comprises a first gate structure, and the second nanosheet field-effect transistor comprises a second gate structure, and the backside interlayer dielectric layer is in contact with the first gate structure and the second gate structure.

18. The integrated circuit of claim 17, where a portion of the source/drain region extends above the backside interlayer dielectric layer and is located between the first field-effect transistor and the second field-effect transistor.

19. The integrated circuit of claim 18, wherein the first field-effect transistor and the second field-effect transistor comprise respective nanosheet field-effect transistor devices.

20. The integrated circuit of claim 15, wherein the at least one of the one or more semiconductor structures further comprises a first nanosheet field-effect transistor disposed on the backside interlayer dielectric layer and a second nanosheet field-effect transistor disposed on the backside interlayer dielectric layer and adjacent the first nanosheet field-effect transistor;
　　wherein the first nanosheet field-effect transistor and the second nanosheet field-effect transistor comprise inner spacers that are composed of a segment of one of the first sidewall spacer and the second sidewall spacer.

\* \* \* \* \*